United States Patent [19]

Sakurai et al.

[11] Patent Number: 5,377,405
[45] Date of Patent: Jan. 3, 1995

[54] METHOD FOR MOUNTING COMPONENTS AND AN APPARATUS THEREFOR

[75] Inventors: Hiroshi Sakurai; Hitoshi Onodera; Kenichi Indo; Hiroyuki Ohta, all of Iwata, Japan

[73] Assignee: Yamaha Hatsudoki Kabushiki Kaisha, Iwata, Japan

[21] Appl. No.: 86,512

[22] Filed: Jul. 1, 1993

[30] Foreign Application Priority Data

Jul. 1, 1992 [JP] Japan ................... 4-174387
Aug. 7, 1992 [JP] Japan ................... 4-211838

[51] Int. Cl.⁶ .................... H05K 3/30; B23P 19/00
[52] U.S. Cl. ........................... 29/833; 29/740; 29/759
[58] Field of Search ............. 29/740, 832, 759, 836

[56] References Cited

U.S. PATENT DOCUMENTS

| | | | |
|---|---|---|---|
| 4,480,780 | 11/1984 | Claeskens | 29/759 X |
| 4,706,379 | 11/1987 | Seno et al. | 29/740 |
| 4,794,689 | 1/1989 | Seno et al. | 29/740 |
| 4,881,319 | 11/1989 | Yagi et al. | 29/740 X |
| 4,905,370 | 3/1990 | Hineno et al. | 29/740 |
| 5,031,309 | 7/1991 | Kim | 29/832 |
| 5,035,047 | 7/1991 | Harigane et al. | 29/836 X |
| 5,040,291 | 8/1991 | Janisiewicz et al. | 29/740 X |
| 5,088,187 | 2/1992 | Takata et al. | 29/740 X |

FOREIGN PATENT DOCUMENTS

| | | |
|---|---|---|
| 0144717 | 10/1984 | European Pat. Off. . |
| 0416878 | 3/1991 | European Pat. Off. . |
| 0471272 | 2/1992 | European Pat. Off. . |
| WO92/14988 | 9/1992 | WIPO . |

OTHER PUBLICATIONS

IECON' 90 vol. 1, Nov. 30, 1990, Pacific Grove Calif. U.S.A., pp. 798–804, XP000217328.
ICOS Vision Systems NV 'New trends in SMD pick & place machines put high demands on vision systems' p. 804, FIG. 10.

Primary Examiner—Carl J. Arbes
Attorney, Agent, or Firm—Knobbe, Martens, Olson & Bear

[57] ABSTRACT

A number of embodiments of component pick up and mounting devices that include a plurality of pick up heads. The speed of the device is improved by providing sensing of the orientation of the components picked up by the pick up devices in a common sensing station. The device also includes means whereby one of the pick up devices may pick up a component large enough to interfere with the picking up of components by the other pick up devices by precluding the picking up of components by the other pick up devices when such a component is picked up by the one pick up device. The device further increases the speed by permitting pick up, recognition and correction of component orientation and mounting either simultaneously or operation of two or more of these functions at the same time on different pick up devices.

56 Claims, 22 Drawing Sheets

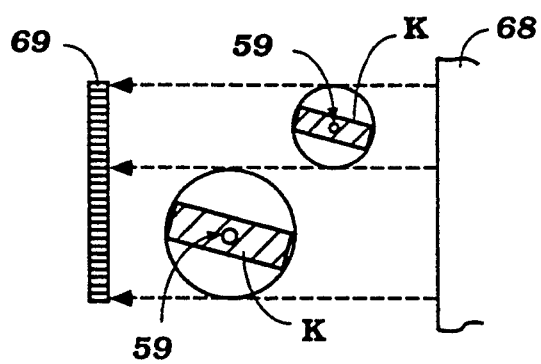
Figure 10
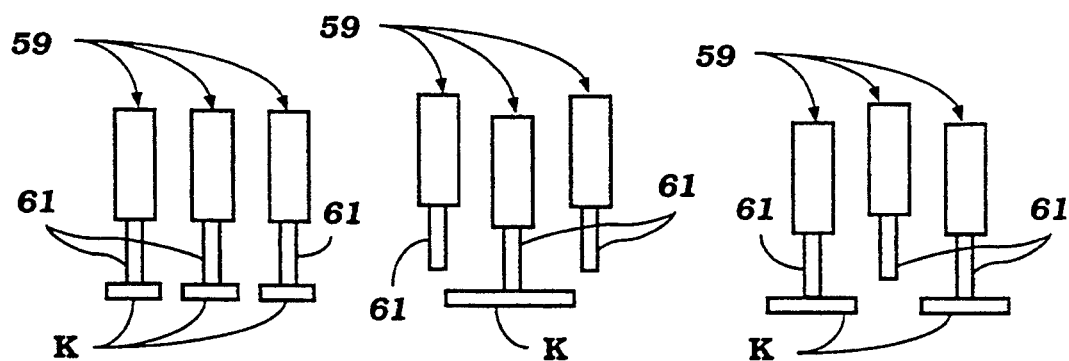
Figure 11  Figure 12  Figure 13

METHOD FOR MOUNTING COMPONENTS AND AN APPARATUS THEREFOR

BACKGROUND OF THE INVENTION

This invention relates to a method and apparatus for mounting components and more particularly to an improved device that permits the handling of a plurality of components at the same time.

There are provided a wide variety of device that are intended to pick up articles at one position, transport them to another position and place them in an accurate location. Chip or component mounters for electrical apparatus are this type. Such component mounters will pick up a component such as an integrated circuit, capacitor, resistor or the like at a feed station, sense the orientation in which the article is picked up and then transport it to a station where it is mounted on a substrate such as a printed circuit board with the mounting being done to compensate for variations in the orientation in which the article is picked up in accordance with the previously made measurement.

Although this type of apparatus is extremely valuable, the necessity for picking the article up, determining its orientation and then subsequently mounting it with the mounting being corrected for variations in the orientation of the component as it is picked up, is rather time consuming.

It is, therefore, a principal object to this invention to provide a mounting method and apparatus which permits a plurality of components to be handled at the same time.

One area where the procedure is slowed down is in the sensing station where the orientation of the picked up component is sensed. If a single sensing station is employed and if only a single component can be sensed at the station at one time, then the handling time will be dictated by this sensing station and the entire apparatus will be slowed down.

It is, therefore, a further principal object to this invention to provide a method and apparatus whereby a plurality of components can be sensed in a single sensing station, thus speeding up the operation of the entire apparatus.

The actual sensing of a plurality of articles in a single sensing station has obvious advantages. If the articles can all be sensed at the same time or in the same star ion, then production can substantially be increased. However, with many types of sensors it is necessary to move the component while it is being sensed. Such movement can, however, interfere with other components in the same station.

It is, therefore, a further object to this invention to provide a method and apparatus whereby a plurality of components can be sensed in a single station without resulting in interference between the components.

If an apparatus is provided that includes a plurality of pick up devices for picking up a plurality of objects, and the plurality of pick up heads are mounted on a single carriage, the system can be greatly simplified. That is, if it is necessary to provide a support that permits translational movement independent of a plurality of mounting heads, the apparatus becomes extremely complicated and means must be insured so as to prevent the various pick up devices from running into each other or interfering with each other's operation.

It is, therefore, a still further object to this invention to provide an article handling apparatus wherein a plurality of component pick up device are carried by a single carriage that is moveable for movement of the gripped components between pick up stations and discharge points.

Where there are provided a plurality of pick up devices on the same carriage, it must be insured that the various operations and movements of the components when they are picked up, sensed and deposited will not interfere with each other. However, if each step must be performed in sequence on a single component and the sequence is not repeated for the next component until the sequence for the first component is completed, then the apparatus does not have as many advantages over the prior art type of constructions as would be desirable.

It is, therefore, a still further object to this invention to provide a method and apparatus whereby a plurality of components may be picked up by a plurality of pick ups, sensed and deposited with the sequence of operation being performed in an overlapping relationship so as to permit faster speed of operation.

If a plurality of pick up devices are carried by a single carriage, it is desirable to place those pick up devices in close proximity to each other. However, if this is done then the size of the components which can be handled will be limited by the proximity of the pick up devices to each other.

It is, therefore, a still further object to this invention to provide a component handling apparatus that has a plurality of pick up devices carried by a single carriage by wherein components that are larger than the space between the pick up devices may be handled if desired.

SUMMARY OF THE INVENTION

A first feature of this invention is adapted to be embodied in a device for picking up and mounting components that is comprised of a carriage supported for translational movement. A plurality of pick up devices are carried by the carriage and each is adapted to pick up a respective component. A sensing station is provided for detecting information from the components held by the pick up devices. The sensing station is configured so as to enable the sensing of all of the components carried by each of the pick up devices in a single position on the carriage.

Another feature of the invention is also adapted to be embodied in a device for picking up and mounting components. This device includes a carriage assembly that is mounted for translational movement. A plurality of pick up devices are supported by the carriage and each is adapted to pick up a respective component. Means are provided for effecting the picking up of a component by one of the pick up devices simultaneously with the performance of an operation on a component held by another of the pick up devices.

A further feature of the invention is also adapted to be embodied in a device for picking up and mounting components. The device comprises of a plurality of pick up devices, each adapted to pick up a respective component and all mounted on a common carriage for translational movement. The pick up devices are positioned in close proximity to each other on the carriage. Means preclude the picking up of a component by one of the pick up devices when the component picked up by an adjacent pick up device has a configuration that would interfere with a component picked up by the one pick up device.

BRIEF DESCRIPTION OF THE DRAWINGS

FIG. 10 is a top plan view, in part similar to FIGS. 7 and 9, and shows how the sensing device can operated when two rather than three pick up nozzles are employed.

FIG. 11 is a side elevational view of the pick up apparatus showing the pick up mode when three comparable sized components are picked up by the respective pick up heads.

FIG. 12 is a side elevational view, in part similar to FIG. 11, and shows the relationship when only a single large component is picked up.

FIG. 13 is a side elevational view, in part similar to FIGS. 11 and 12, and shows how two objects can be picked up which objects are large enough to preclude the picking up of three objects.

FIG. 19 shows the component as picked up on phantom line views and as initially rotated in solid lines.

FIG. 20 shows the component in the minimum width condition in solid lines and the starting position in phantom lines.

FIG. 21 shows the component in its final rotated position in solid lines and in its starting position in phantom lines.

DETAILED DESCRIPTION OF THE PREFERRED EMBODIMENTS OF THE INVENTION

Figure 1:
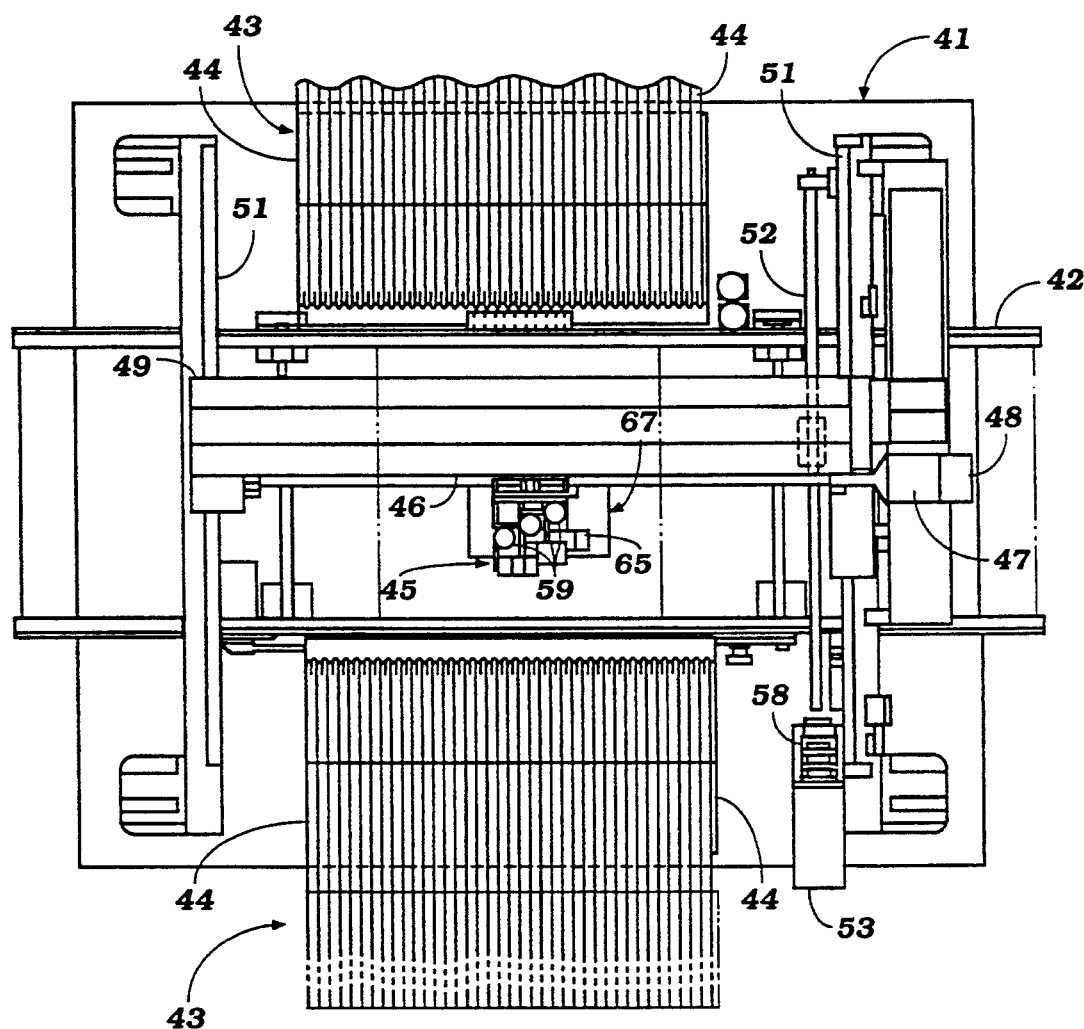
FIG. 1 is a top plan view of an apparatus constructed and operated in accordance with an embodiment of the invention.
Figure 2:
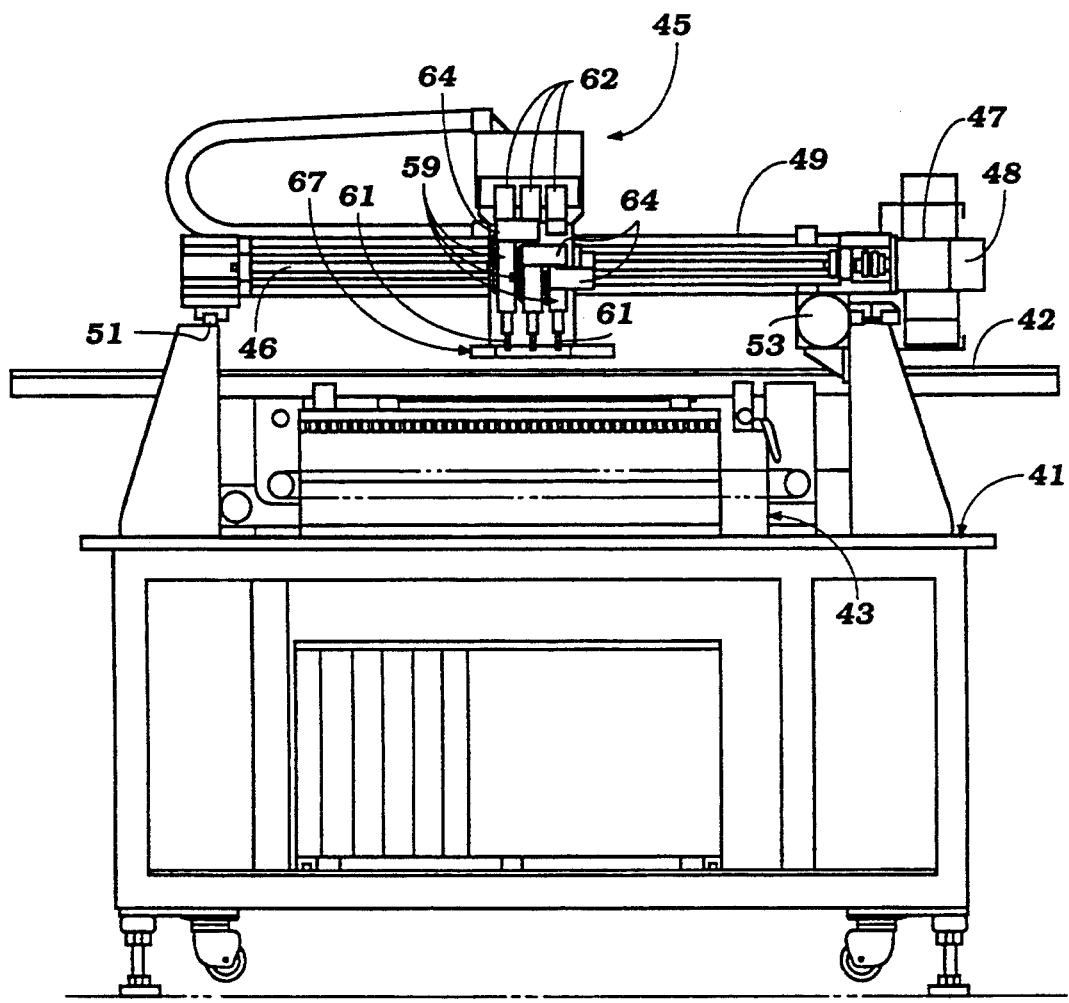
FIG. 2 is a side elevational view of the apparatus.
Figure 3:
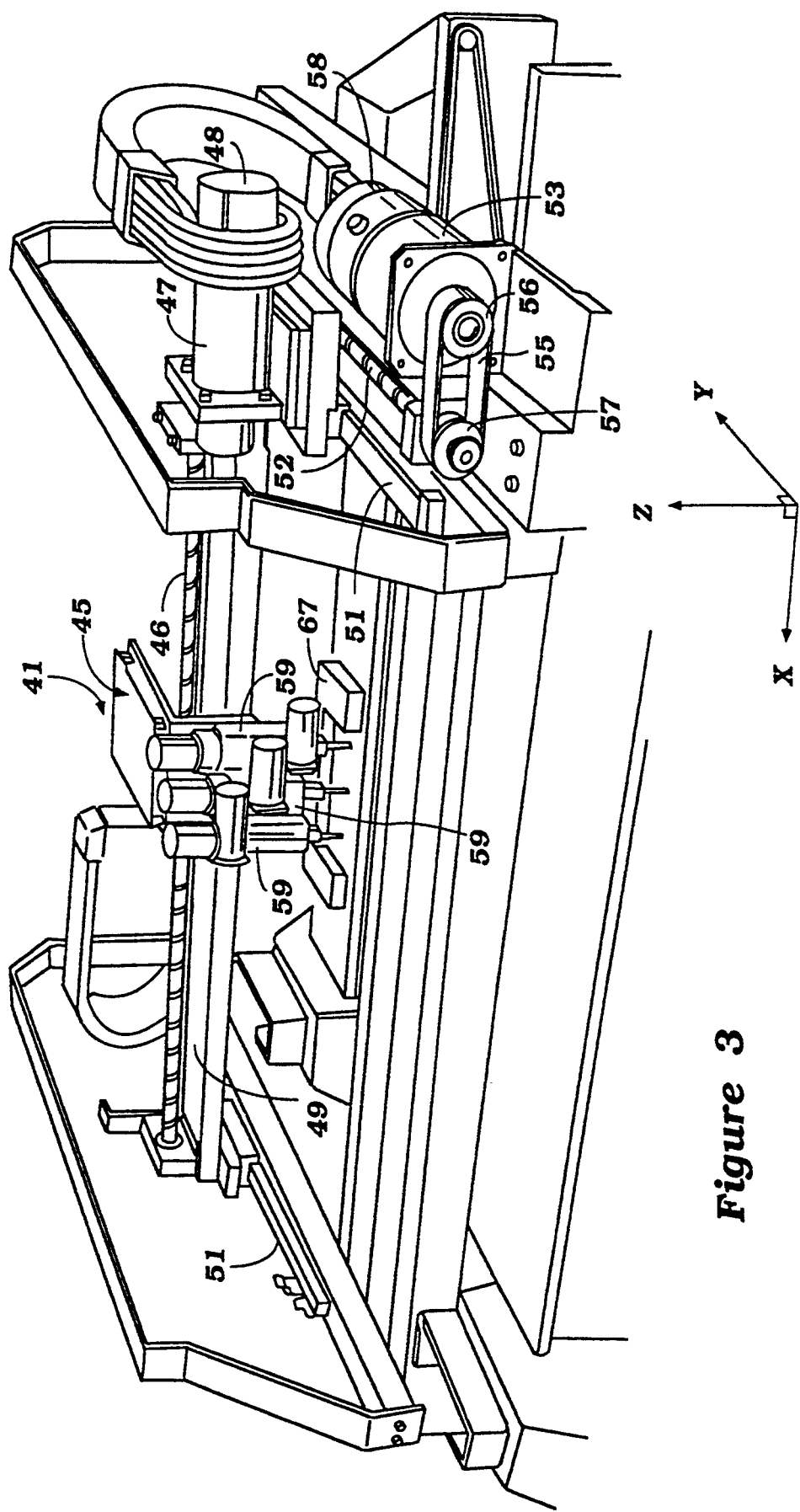
FIG. 3 is a perspective view showing a portion of the apparatus in slightly different configuration.

Referring first to FIGS. 1 through 3, a mounting apparatus constructed in accordance with an embodiment of the invention is identified generally by the reference numeral 41. The mounting apparatus 41 cooperates with a conveyor section 42 on which substrates such as printed circuit boards or the like are presented to a mounting station. Individual components are selected, in a manner to be described from pick up stations 43 disposed on opposite sides of the conveyor 42 and which each comprise a plurality of feeder devices 44 such as conventional tape-type feeders which sequentially present a plurality of different types of components of the aforenoted type for selection and mounting in the manner to be described.

The mounting apparatus 41 includes a carriage 45 which is mounted for movement in an "XX" direction on a feed screw 46. The feed screw 46 is driven by a servo motor 47 and which has coupled to it an encoder 48 that provides a signal indicative of the rotation of the feed screw 46 and accordingly the position of the carriage 45 along the "XX" axis.

The mechanism as thus far described is all mounted on a carriage 49 which carriage is, in turn, supported for movement in the "YY" direction on a pair of spaced apart guide rails 51 that are disposed at opposite ends of the mounting apparatus 41 and which extend in the "YY" plane.

A feed screw 52 is rotatably journalled by one of the guide rails 51 and is driven by a servo motor 53 either directly as shown in FIGS. 1 and 2 or through a belt drive 55 by means of a driving pulley 56 affixed to the shaft of the servo motor 53 and a driven pulley 57 affixed to the end of the feed screw 52. In either event, an encoder 58 is driven by the servo motor 53 so as to provide an indication of the position of the carriage 45 and guide rail 51 in the "YY" direction.

In accordance with the invention, a plurality of pick up heads, each indicated generally by the reference numeral 59 is mounted on the carriage 45 for picking up components from the feeders 44, correctly orienting them, and positioning and mounting them on a substrate presented by the conveyor 42. In the illustrated embodiment, three such pick up heads 59 are carried by the carriage 45, although it is to be understood that the number of pick up heads employed can be varied to suit particular applications.

Figure 4:
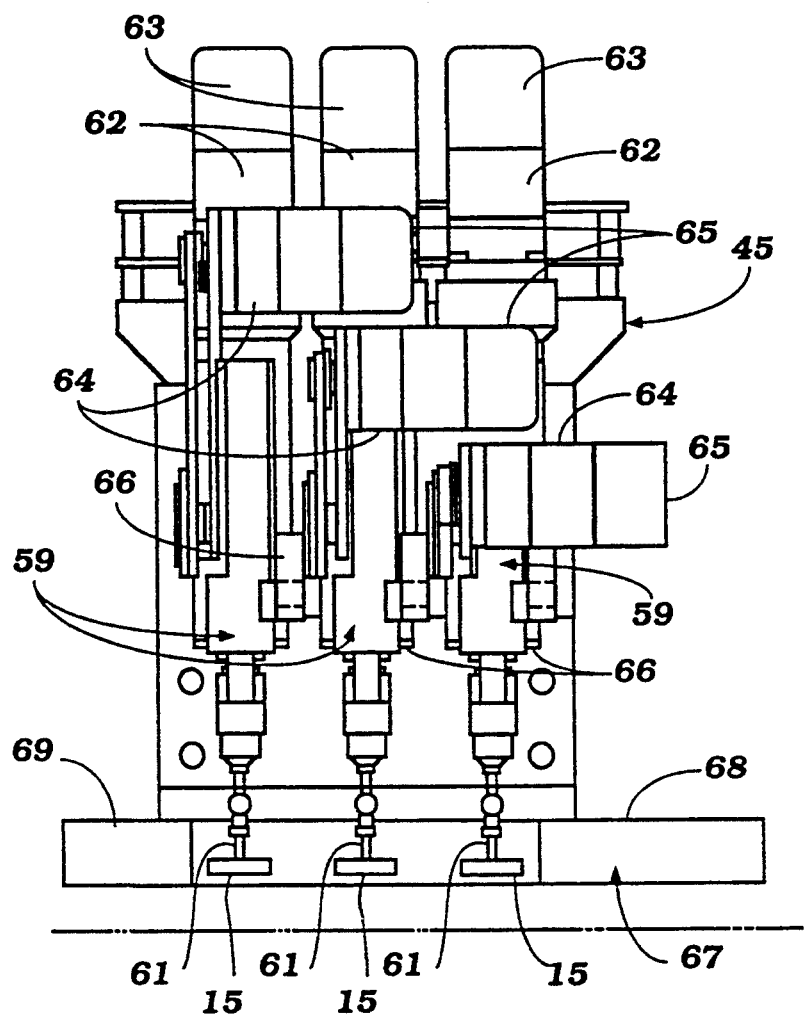
FIG. 4 is an enlarged side elevational view showing the pick up apparatus in the sensing position.
Figure 5:
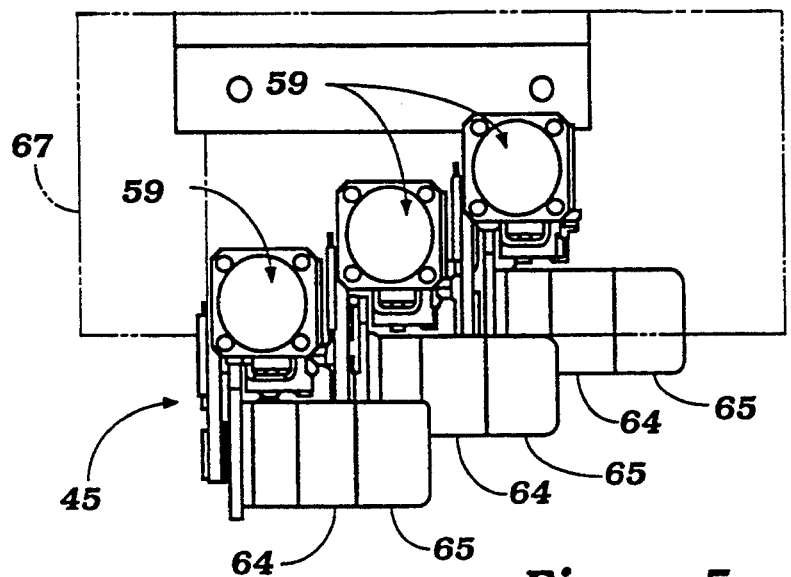
FIG. 5 is a top plan view of the portion of the construction shown in FIG. 4.
Figure 6:
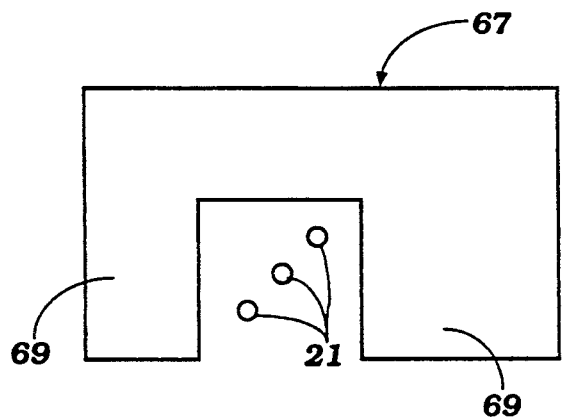
FIG. 6 is a top plan view of the sensing apparatus in accordance with an embodiment of the invention.

In order to understand better the sequence of operation, the pick up heads are each identified by separate reference numerals bearing the suffixes −1, −2, and −3 so as to enable ease of understanding of the operation. As may be seen in FIG. 5, the pick up heads, 59-1, 59-2 and 59-3 are staggered slightly along an inclined line to the "XX" and "YY" axes, although, as will become apparent, this staggering is not essential. This construction is also shown in FIGS. 4 and 5 and the description of each pick up head 59 will be described in detail now by reference to these additional figures.

In the illustrated embodiment, the pick up heads 59 are depicted as being of the vacuum type and include individual pick up nozzles 61. It is to be understood that the invention may be employed with a plurality of different types of pick up device, however, the invention has particularly utility with vacuum type devices. Each pick up head 59 and is associated pick up nozzle 61 is supported for movement both in an axial direction along the "ZZ" axis and for rotary motion about an axis coincident with the pick up head 59 and hereinafter referred to as the "R" axis.

Movement in the "ZZ" direction is controlled by a servo motor 62 that drives the pick up nozzle 61 between its lowered and raised positions and which is coupled to an encoder or position sensing device 63 so as to determine the location of the pick up nozzle 61 in the "ZZ" direction. Rotary motion about the "R" axis is accomplished by means of a servo motor 64 which is coupled to the pick up nozzle 61 to rotate it about the "R" axis. An encoder 65 is coupled with the servo motor 64 so as to provide a position signal indicative of the angular position $\theta$ about the "R" axis.

Two further types of sensor mechanisms are carried by the carriage 45. These include an interference detector 66 carried by each up head 59 which is operative to provide an signal when the respective pick up nozzle 61 has moved along the "ZZ" direction until a position clear of the where articles have been picked up so as to permit movement of the pick up head 59, as will be described.

As a further sensor, there is a provided a single optical measuring device which is mounted on the carriage 45 and which cooperates with each of the pick up heads 59. This optical device is indicated generally by the reference numeral 67 which includes a laser light source 68 that emits a plurality of parallel light rays "L" as shown in FIGS. 7, 9, 10 and FIGS. 19 through 21 and 23 which are obstructed by the picked up components, indicated at "K" on a photo-detector 69 such as a CCD. As may be seen in FIG. 14, the laser measuring unit 67 is connected to a laser processor 71 that outputs and receives signals from an input/output means 72, for a purpose which will be described.

As may be clearly seen in FIGS. 1, 3, 5, 6 and 7, the pick up heads 59 are staggered relative to each other in the "Y" direction. This is done so that the light rays "L" will impinge upon each of the pick up articles "K" and cast a shadow on a respective portion of the CCD 69 as clearly shown in FIG. 7. It would be possible to place the pick up heads 59 in an aligned relationship in the "YY" direction as shown in FIGS. 8 and 9 but if this is done, then the laser measuring device 67 must be rotated at an angle so that each picked up article "K" will have its own sensing area on the CCD 69 with no overlap therebetween.

Figure 7:
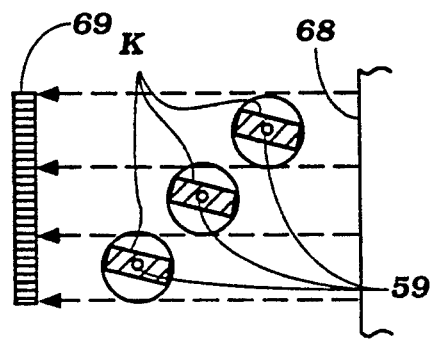
FIG. 7 is a further enlarged view of the area shown in FIG. 6 and illustrates how the detecting device can sense a plurality of objects in one sensing position.
Figure 8:
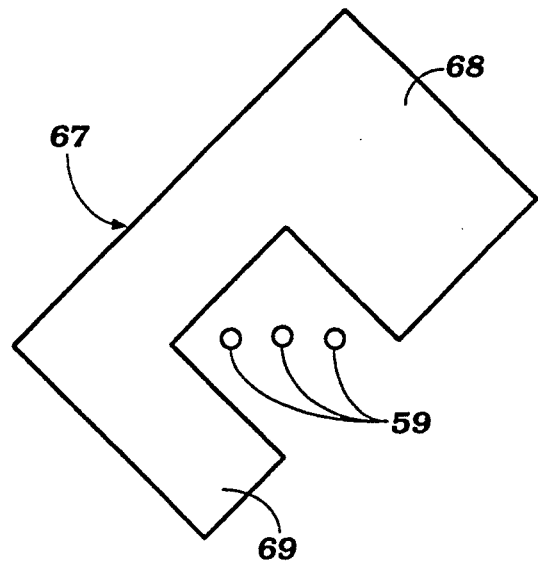
FIG. 8 is a top plan view, in part similar to FIG. 6, and shows another possible orientation for the sensing section.
Figure 9:
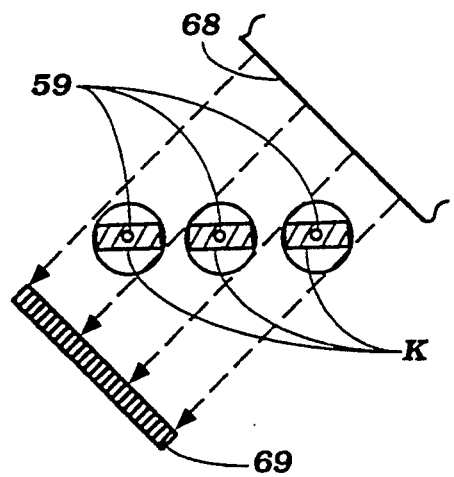
FIG. 9 is a further enlarged to plan view, in part similar FIG. 7, for the embodiment of FIG. 8.

FIGS. 6, 7 and 8, 9 and FIG. 11 show the relationship when the picked up articles "K" picked up by each of the pick up nozzles 61 have substantially the same peripheral dimensions as shown by the circles in FIGS. 7 and 9. This is the maximum size of picked up component "K" that can be accommodated when each of the pick up nozzles 61 holds a component "K". However, the apparatus 41 is capable of picking up larger articles such as an article as shown in FIG. 12 that is so large that it would overlap components held by the other pick up nozzles 61 if picked up by the center pick up nozzle 61. Also, it is possible to pick up two articles "K" which are large enough so that they would overlap a components picked up by the center pick up nozzle 61 as shown in FIG. 13. In addition, articles that are different in peripheral dimensions may be picked up by two of the nozzles as shown in FIG. 10. The important point to remember is that the peripheral dimensions of the picked up articles "K" should be such that they will not overlap on the viewing area of the CCD 69. The reason for this is so that all articles can be measured at the same time if this is the desired program routine and also so that there will be no other interference.

Figure 14:
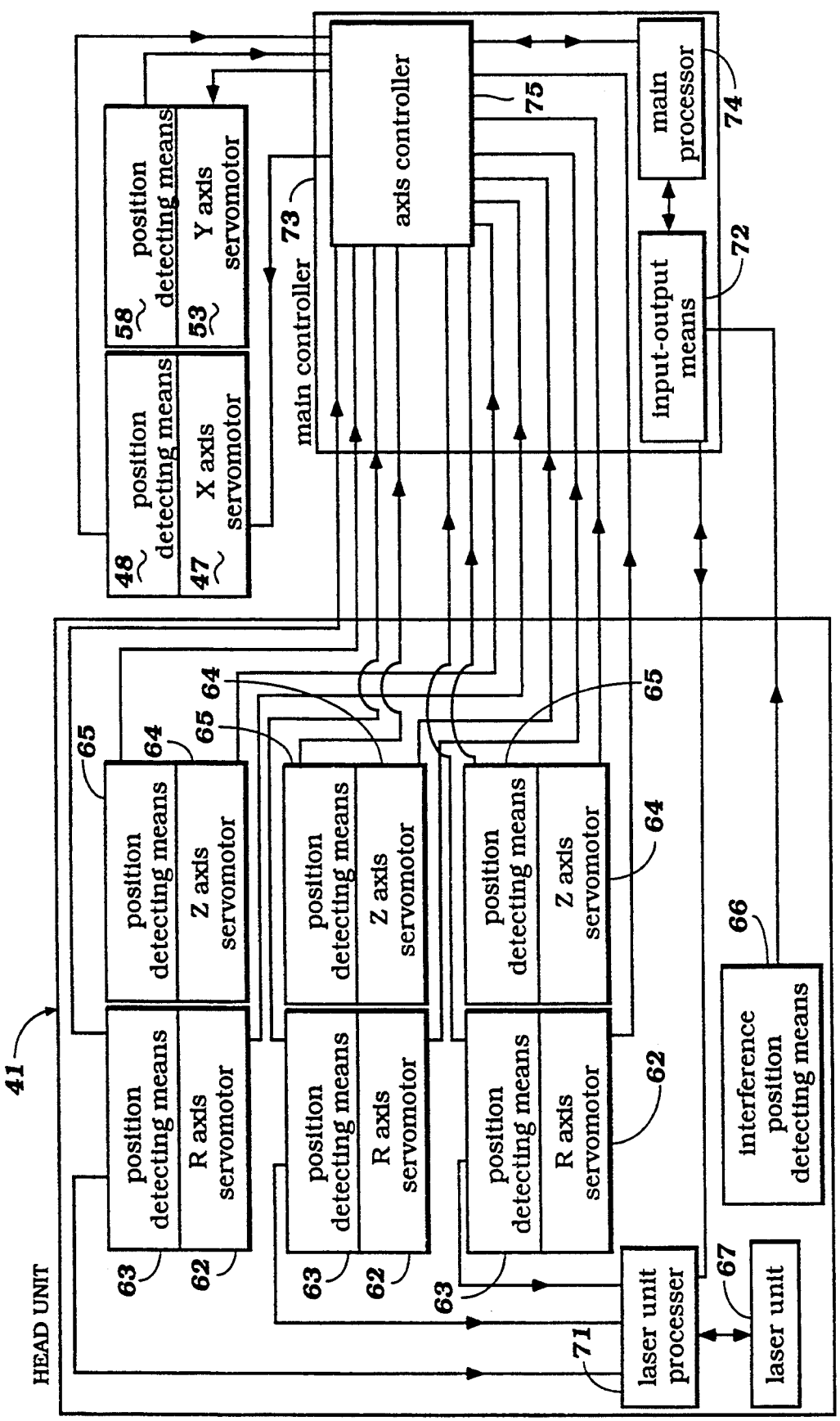
FIG. 14 is a block diagram showing how the components of the apparatus are arranged in a schematic fashion in accordance with one embodiment of the invention.

Referring now specifically to FIG. 14, the system is provided with a main controller, indicated by the reference numeral 73 which includes in addition to the input/output means 72, a main processor 74 that provides the control sequence which will be described. This main processor 74 controls the transmission of signals from the input/output means 72 and the interference detectors 66 and also provides axis control to an axis controller 75 which will set the various positions of the components, as will now be described.

Figure 26:
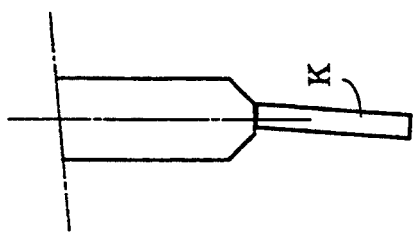
FIGS. 24 through 26 are side elevational views of the pick up nozzle and a picked up component showing it in a normal picked up condition, and two abnormal picked up conditions, respectively.
Figure 25:
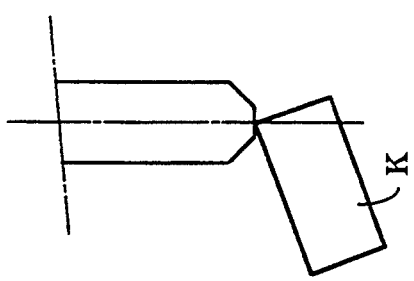

A method by which the apparatus operates will now be described by reference to FIG. 15 which is the main control routine with certain sub control routines being shown in FIGS. 16, 17 and 18, these being the pick up, orientation calculation and deposit procedures, respectively. FIGS. 19 through 23 show the manner by which the orientation correction factors are calculated and FIGS. 24 through 26 show the way in which the apparatus determines if the components "K" have been picked up properly by the pick up nozzles 61 or not.

Figure 15:
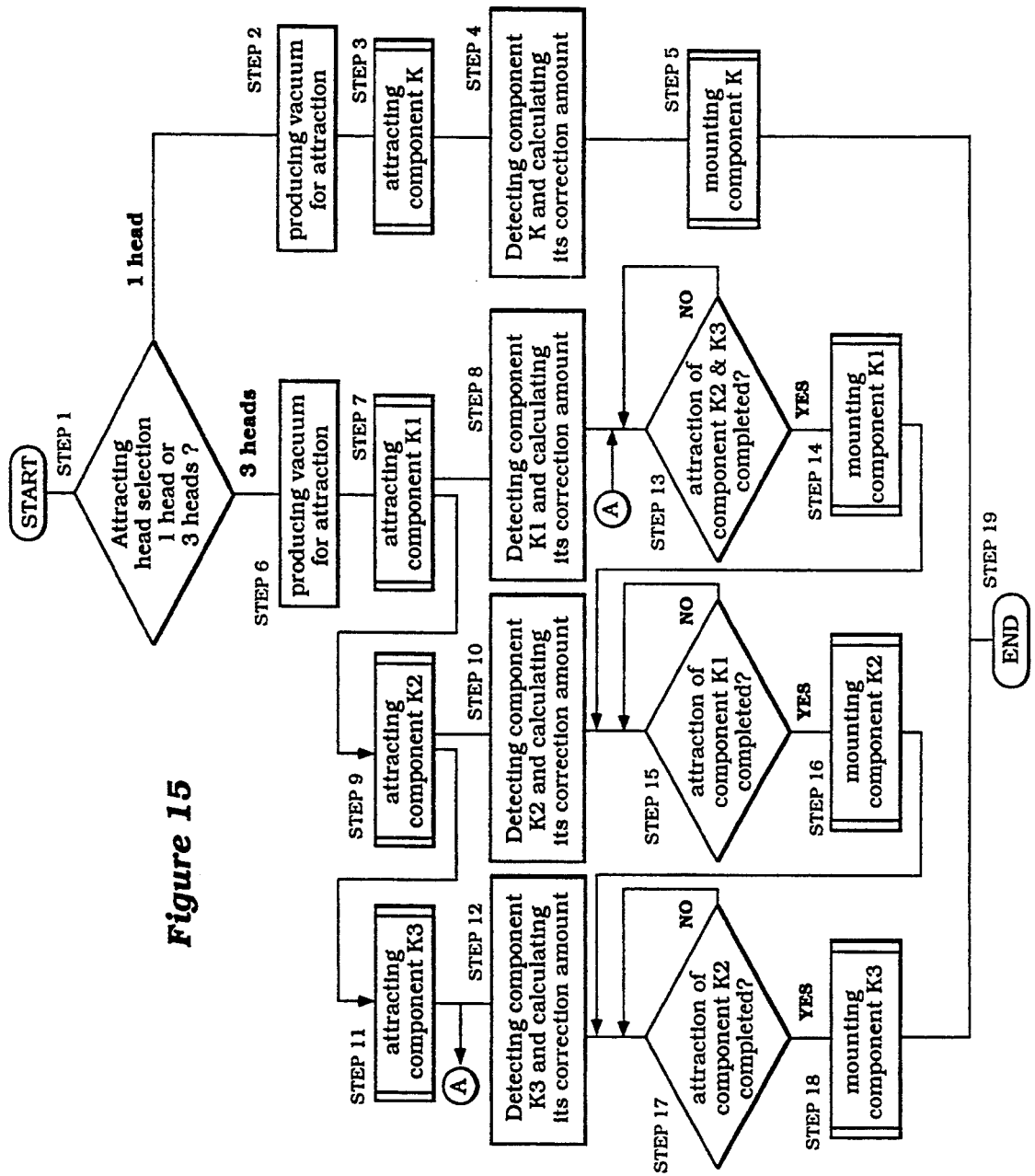
FIG. 15 is a block diagram showing the overall control routine in accordance with a first embodiment of the invention.

Referring initially to FIG. 15, the apparatus starts at the Step 1 to determine if the attracting selection for the components "K" to be picked up requires one, two or three heads. The program shows the process for attracting a component by only one head under the alternate control routine embodying Steps 2, 3, 4 and 5 or three heads beginning with the Step 6. It should be understood, however, that the process when two heads are employed will be the same as that beginning at Step 6 but the third component pick up will be deleted.

As previously noted, the number of pick up heads to be employed will be determined by the size of the component or components to be picked up. FIGS. 6, 7 or 8 and 9 and FIG. 11 show the picking up of three components, one by each pick up nozzle 61. FIG. 13 shows the picking up of two components "K" by two of the pick up nozzles 61 while FIG. 12 shows the picking up of only one component by one of the pick up nozzles 61. FIG. 10 also shows the picking up of two components "K" but wherein those components have different sizes. The size of the component picked up will be encoded into the mechanism at each of the feeder stations 44 so that the apparatus can make this determination.

Assuming that only one attracting head has been employed, the program then moves to the Step 2 so as to provide the vacuum to the appropriate pick up nozzle for its vacuum pick up and the program then moves to the Step 3 so as to attract the picked up component "K". It should be noted that the method by which this is done is the same for each pick up head regardless of the number of pick up heads employed and this method is shown in FIG. 16 and will be later described by reference to that figure.

Once the component "K" has been picked up at the Step 3, the program then moves to the Step 4 so as to determine the orientation of the component picked up and to calculate its correction amount, which is done the same for each pick up head in the manner which will be described in conjunction with the routine of FIG. 17 with the method of calculation also being described by reference to FIGS. 19 through 23.

Figure 18:
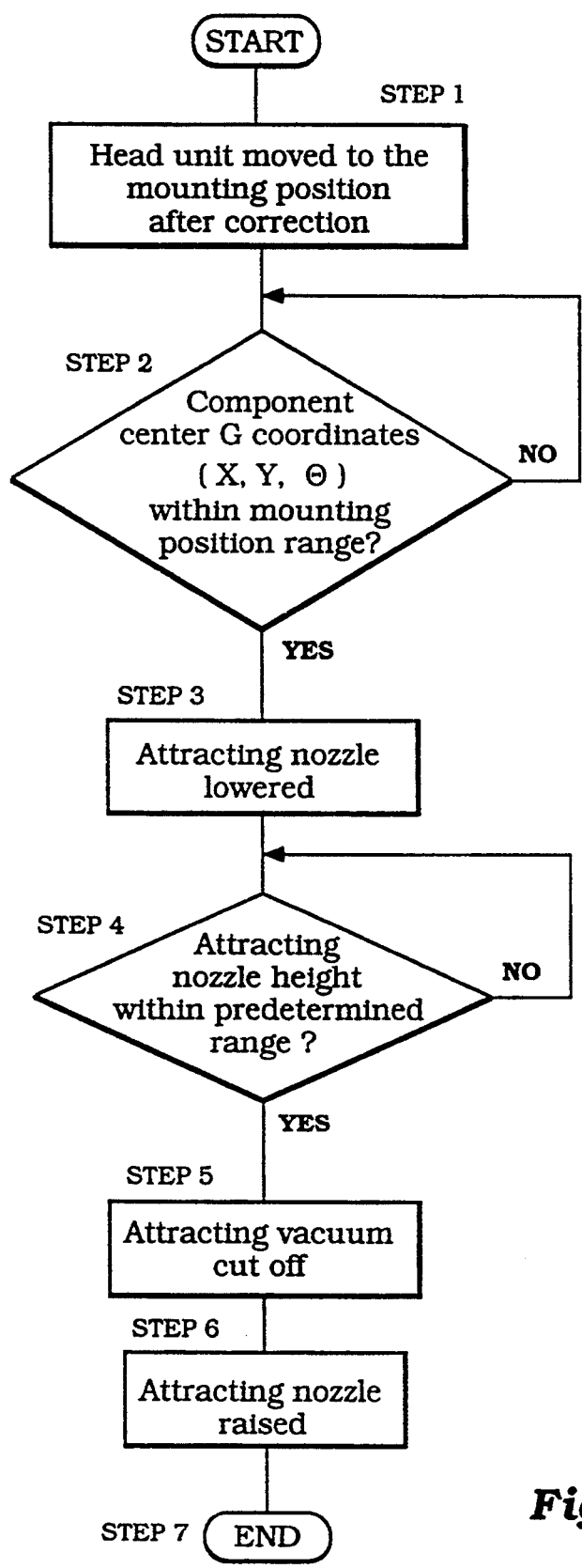
FIG. 18 is a block diagram of a further sub control routine of the routine, shown in FIG. 15 and shows the sub routine for mounting the components when positioned over the substrate.
Figure 19:
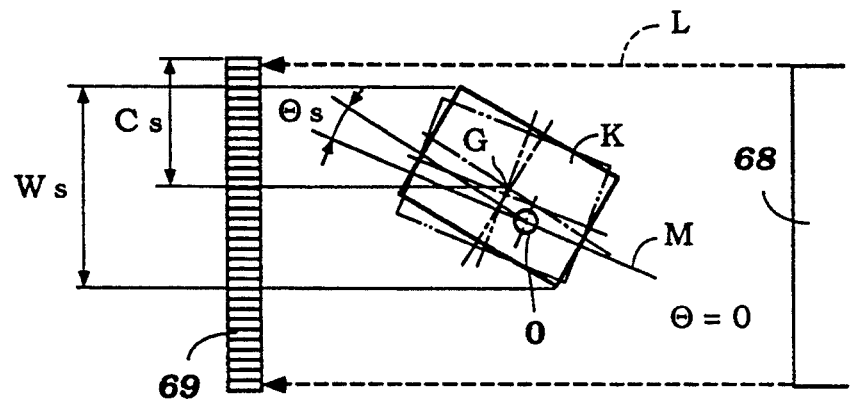
FIGS. 19 through 21 are further enlarged top plan views showing how the orientation of the picked up component is determined.

Once the correction factors are determined, the program then moves to the Step 5 so as to mount the component in accordance with the control routine of FIG. 18. Again, the mounting procedure for each of the mounting heads 59 is the same so the description of that figure will apply to all control routines.

If at the Step 1 of FIG. 15 it has been determined that more than one component will be picked up by the various pick up heads 59-1, 59-2 and 59-3 of the apparatus carried by the carriage 45, then the program must determine if all of the components are positioned so that they can be picked up simultaneously or whether they must be picked up sequentially. This will be determined by which of the feeder stations 44 the components will be picked up from. If the feeder stations are disposed so that the nozzles 61-1, 61-2 and 61-3 may all operate simultaneously the program will execute this pick up simultaneously. Alternatively, if the location of the feeder stations 44 for the various pick up nozzles 61-1, 61-2 and 61-3 are disposed such that the carriage 45 must be moved for registry with different feeder stations 44, then the operation will be performed sequentially. The control routine of FIG. 15 may be employed for operating either simultaneous or sequential pick up depending upon the location of the feeder stations 45 from which the components "K-1", "K-2" and "K-3" will be picked up.

The program proceeds from the Step 1 of FIG. 15 to the Step 6 wherein vacuum is applied to all of the pick up, nozzles 61-1, 61-2, and 61-3 which will be employed to pick up components "K-1", "K-2" and "K-3" with the control routine showing the picking up of components by each of the pick up nozzles 61-1, 61-2 and 61-3. It is believed apparent to those skilled in the art how the system will operate if less than three components but more than one component will be picked up.

The program then moves to the Step 7 so as to move the pick up nozzle 61-1 in a location to pick up the component "K-1" and to pick up that component. If the components "K-2" and "K-3" are located so that they can be picked up in the same position of the carriage, then these pick ups will be accomplished simultaneously at the Steps 9 and 11 of FIG. 15.

Figure 17:
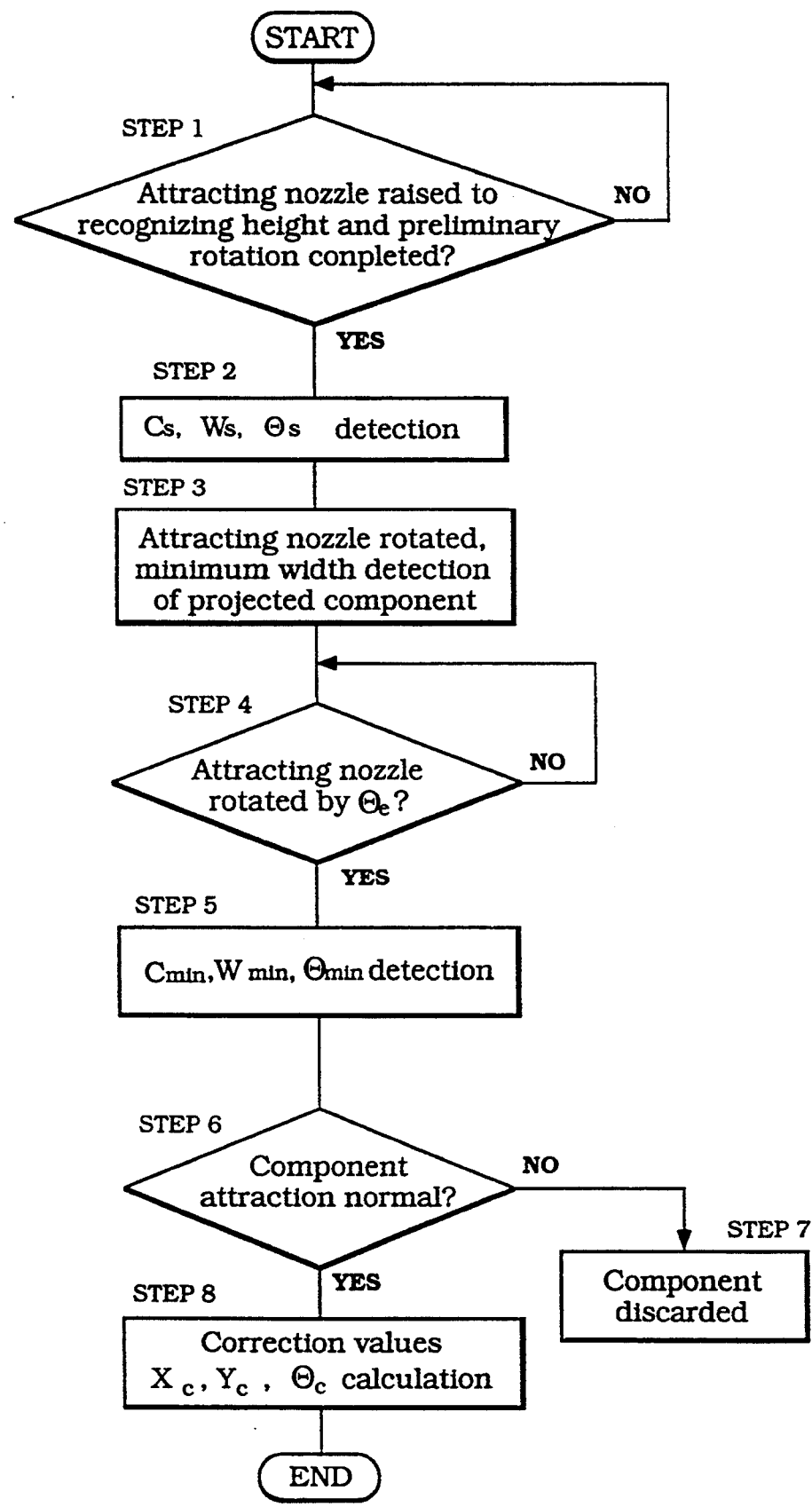
FIG. 17 is a block diagram showing the portion of the control routine wherein the orientation of the picked up component is determined and so as to achieve the correction factors in response to its orientation.

After the component "K-1" has been picked up by the pick up nozzle 61-1, the program moves to the Step 8 so as to detect the component "K-1" and correct its calculation amount the same as was done in Step 4 if only one component was picked up and this calculation is done in accordance with FIG. 17, as aforenoted. If at the Step 7 it was not possible to pick up all of the components "K-1", "K-2" and "K-3" simultaneously, then simultaneous with the performance of Step 8, the program moves to Step 9 so as to pick up the next component "K-2" by the pick up nozzle 61-2.

Assuming that all components "K-1", "K-2" and "K-3" were picked up simultaneous, then Steps 10 and 12 of FIG. 15 can be performed simultaneously with the operation of Step 8 wherein the detection of the components "K-2" and "K-3" and the respective calculation. Of the corrected amounts is performed simultaneously. If simultaneous operation is not possible, then once the component "K-1" has been attracted the program can move to the Step 9 so as to pick up the component "K-2" and once this component is picked up, the program can simultaneously perform the Step 10 to detect the component "K-2" and calculate its correction amount and move to the Step 11 so as to attract the component "K-3".

If sequential pick up was required, after the component "K-3" has been picked up by the pick up nozzle 61-3, the program can then progress to the point "A" to initiate Step 13 simultaneously with the performance of Step 12 wherein the component "K-3" is detected and its correction amount calculated again in accordance with the control routine of FIG. 17.

Thus, even though sequential pick up may be required, the apparatus is capable of performing steps at each pick up nozzle 61-1, 61-2 and 61-3 simultaneously even though they are different operations being performed. That is, a component may be attracted at one pick up nozzle while a calculation and detection is being carried on simultaneously at another pick up nozzle even if it is necessary for the carriage 45 to be moved to accommodate the second or third pick up.

It should be readily obvious that the carriage assembly cannot be operated to move the pick up head unit 41 and carriage 45 to the mounting position until all of the components "K-1", "K-2" and "K-3" have been picked up. Hence, after the calculations and corrections have been made at the Step 8 for the component "K-1", the program moves to the Step 13 to determine if the components "K-2, and "K-3" have been picked up. If they have not, the program repeats. If, however, the pick up of all of the components has been completed the program can move to the Step 14 so as to mount the component "K-1" in accordance with the sub control routine of FIG. 18 which is the same as that accomplished at the Step 5 when only one component is picked up.

As has been previously noted, if the location where the components "K-1" "K-2" and "K-3" are to be mounted on the substrate is the same as the spacing being the pick nozzles 61-1, 61-2 and 61-3 on the carriage 45, then the components can all be mounted simultaneously in accordance with the Steps 16 and 18. However, if it is necessary to move the carriage 45 to successively mount the components, then the program cannot perform this simultaneous operation. The program as shown in FIG. 15 accomplishes this in the manner now to be described.

After the component "K-2" has been picked up and its correction amount calculated at the Step 10, the program moves to the Step 15 to determine if the component "K-1" has been attracted. If it has not, the program repeats. If, however, it is known at the Step 15 that the component "K-1" has been attracted completed then the program can move the Step 16 to mount the component "K-2" again in accordance with the sub control routine of FIG. 18. The program then moves to the Step 17 now assuming that sequential mounting has been required. At the Step 17 it is determined if the attraction of the component "K-2" has been completed and if it has not, the program must repeat. However, if the attraction of the component "K-2" has been completed then the program can move the Step 18 to mount the component "K-3" again in accordance with the sub control routine of FIG. 18.

From the foregoing description, it should be readily apparent that the system regardless of whether simultaneous pick up and mountings can be accomplished or these must be done sequentially, that there are overlaps in the individual steps so that each pick up nozzle 61-1, 61-2 and 61-3 can be operating to provide certain modes of operation simultaneously with each other as should be apparent from the foregoing description.

With this background in mind, it is now possible to describe the operation of the various sub routines and the pick up or attraction of components as accomplished either in the Step 3 or the Steps 7, 9 and 11 of FIG. 15 will now be described by reference to FIG. 16. It should be noted that in this sub control routine as well as the sub control routines of FIGS. 17 and 18, various steps of the sub control routines may be performed in a slightly different order without departing from the invention. Such variations in orders of steps will present themselves to those skilled in the art and not all of these variations will be described.

Figure 16:
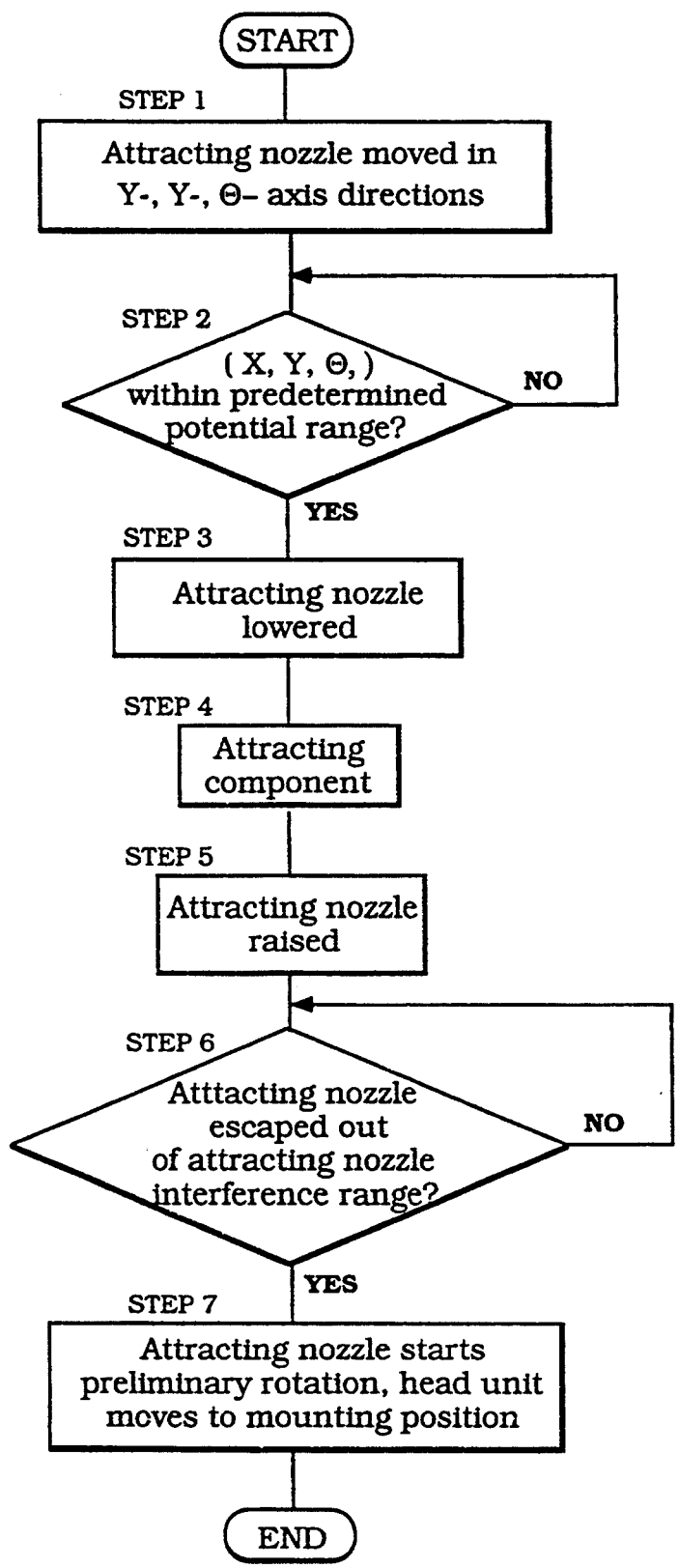
FIG. 16 is a block diagram showing the control routine for the picking up of a component by a nozzle and moving it toward its mounting position as a sub part of the control routine shown in FIG. 15.

It should be noted that before the sub control routine of FIG. 16 has been initiated, the vacuum for attraction of the various pick up nozzle or nozzles has been accomplished at the Steps 2 or 6 of FIG. 15. When the sub control routine or program of FIG. 16 starts it moves to the Step 1 where the axis controller 75 is energized by the main controller 73 so as to move the pick up head 59 to a position above and adjacent the appropriate tape feeder 44. This is done by actuating the "X" and "Y" axes motors 47 53 so as to position the pick up head 59 in the appropriate location and also by actuating the "R" axis servo motor 62 so as to place the pick up head 59 in the desired rotational position prior to pick up. At the same time, the "Z" axis servo motor 64 will have been previously actuated so as to elevate the pick up nozzle 61 away from interference with the tape feeder 44.

The program then at the Step 2 confirms if the pick up head 59 is in the appropriate pick up position. If it is not, the program repeats.

If, however, at the Step 2 it is determined that the pick up head S9 is in a position wherein it is in the allowable range of picking up the components "K", then at the Step 3 the "Z" axis servo motor 64 is actuated so as to lower the pick up nozzle 61 an amount sufficient so that the nozzle 61 can pick up the component "K" contained in the feeder 44.

It can be confirmed that, the component is picked up by detecting the vacuum at the pick up nozzle 61 and once it is confirmed that the component "K" has been picked up, the "Z" axis servo motor 64 is again energized at the Step 5 so as to elevate the pick up nozzle 61.

The program then moves to the Step 6 where the interference detector 66 determines if the pick up nozzle 61 has been elevated sufficiently clear from the tape feeder 41 so as to begin movement of the pick-up head 59. If the clearance is not reached, the program repeats.

When it is determined that the component "K" picked up by the pick up nozzle 61 is clear of the tape feeder 44, then the main controller 73 again actuates the axis control 75 at the Step 7 so as to being movement from the pick up station in the "X" and "Y" directions toward the area where the component "K" will be mounted on the substrate. At the same time, the "R" axis motor 62 is actuated so as to provide an initial degree of rotation $\theta_s$ in a clockwise direction for the picked up component "K" and the pick up nozzle 61. The reason for this will be described later.

It should be noted that the components fed at the stations 43 although being generally oriented in a certain relationship, are not accurately positioned in the necessary orientation. That is, the components are normally contained in pockets in a tape and although those pockets are sized so as to orient the components "K" in a particular relationship, the components may be at different angular positions about an angle $\theta$ relative to the axis "R" of the pick up nozzle 61 and also. displaced along the "X" and "Y" axis from the rotational axis "R" and center of the pick up nozzle 61.

Therefore, the device functions so as to pick up the components from the feeder tapes 44 and first determine the actual orientation of the point of pick up and the component relative to the nozzle. That is, the component may be picked up at an "XY" position that is offset from its center "G" relative to the center "O" of the pick up nozzle 61 for the for the individual component "K" as clearly shown in FIGS. 19 through 21 and 23. Hence, the device functions to provide certain measurements, as will be hereinafter noted, that permit the orientation to be determined and the necessary corrections made by the apparatus so that the components "K" can be accurately mounted.

The sub routine of the operation for orientation detection and correction will now be described by reference to the block diagram of FIG. 17 and cross-reference to FIGS. 19 through 23. The sub routine or program begins at the Step 1 once the sub routine of FIG. 16 has been completed. At the Step 7 it is determined if the component "K" has been raised sufficiently so as to be in proximity to the detector 67 and the initial rotation to the $\theta_s$ has been completed. Once it is determined that the component "K" has been elevated into the detection range, then the detecting operation is begun at the Step 2.

The method of measuring the location of pick up of the component "K" will now be described in addition by reference to FIGS. 19 through 23. As previously noted, the components "K" will be only roughly positioned, at the pick up station where the pick up has occurred. Hence, the center of the pick up nozzle "O" will probably be displaced from the center "G" of the component "K". The angular position 8 will also vary about the rotational axis "R".

In order to insure that the component "K" is in a position other than its minimum width position when initially picked up, once pick up has been accomplished, the component is rotated so that it will be rotated, clockwise through an angle $\theta_s$ from the initial angular position as determined by an arbitrary line "M" drawn through the center of the nozzle "O" which constitutes the $\theta=0$ position.

Hence, this initial rotation through the angle $\theta_s$ will position the chip "K" in an angle $\theta_s$ so that when the light is emitted from the light source 68 to the light sensitive pick up 69, an area indicated as "Ws" which is equal to the width or length of the component "K" in a plane parallel to the "R" axis of the pick up nozzle will be occluded. When this measurement is taken at the Step 2, the center "G" of the component "K" will be displaced at a distance $C_s$ from a line "L" which forms the perimeter at one side of the measurement apparatus.

Figure 20:
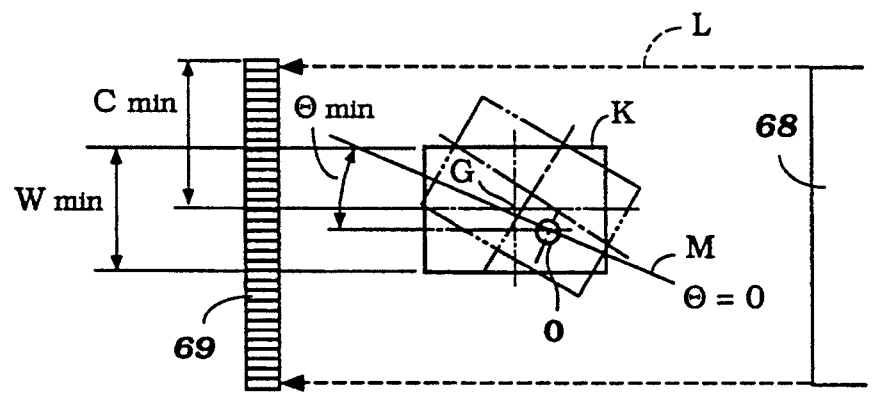
Figure 21:
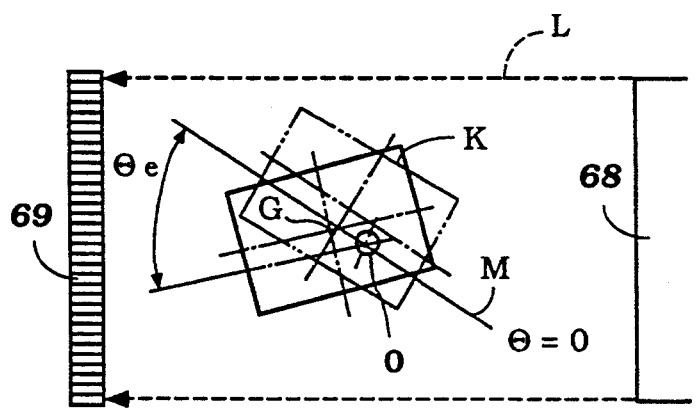

The pick up nozzle 61 is then rotated at the Step 3 in a counter clockwise direction from the previous clockwise rotation through a position as shown in FIG. 20 where the minimum projected width $W_{min}$ is illustrated. At this point, it will be possible to determine the location of the center "G" at the mid point of $W_{min}$ and hence at a distance $C_{min}$ from the line "L". The rotation continues at the Step 4 until a rotation through the predetermined angle $\theta_e$ has occurred as shown in FIG. 21.

Figure 22:
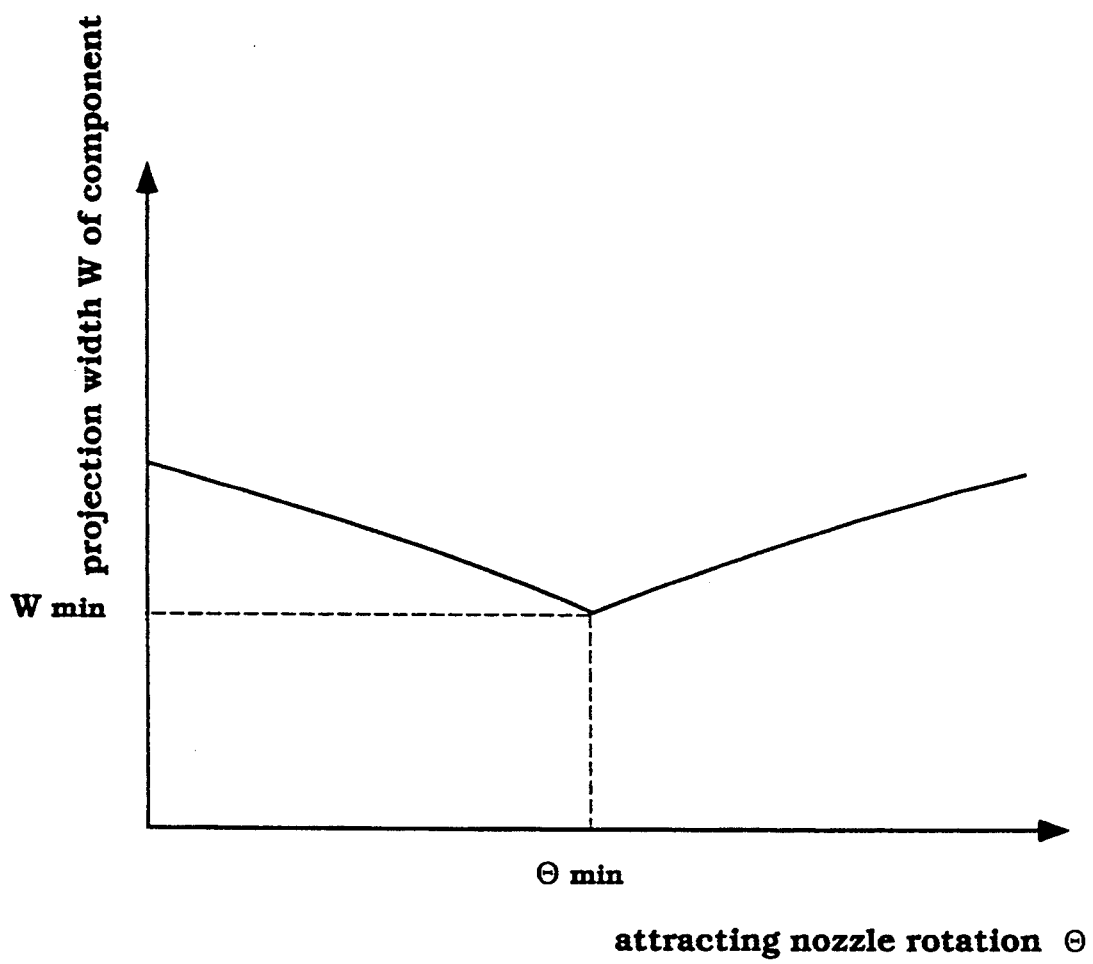
FIG. 22 is a graphical view showing how the width of the component varies during the rotational steps shown in FIGS. 19 through 21.

FIG. 22 shows the way in which the projected width will vary with the $\theta_{min}$ position being that where the projected dimension "W" is at its minimum. The specific angle $\theta_e$ does not have to be a large angle and 45° is an appropriate angle so as to insure that the $W_{min}$ condition can be met.

Once the angular measurement necessary to determine the minimum width $\theta_{min}$ from the position $\theta_s$ has been determined and the width at the minimum width position $W_{min}$ and the initial width $W_s$ have been measured at the Step 5, it will then be possible to determine the actual position of the pick up nozzle "0" relative to the center "G" of the component "K" both in the "X" and "Y" planes and also the angular relationship so as to determine the necessary correction factors in order to place the component "K" at the desired location and orientation on the substrate to which it is to be mounted.

Before making these calculations, however, the program moves to Step 6 to determined if the component "K" has been appropriately attracted and is being held normally as shown in FIG. 24. It is possible that the component "K" could have been picked up in a misdirected orientation as shown in FIGS. 25 and 26 during the initial pick up. If at the Step 6 it is determined that the component "K" has not been appropriately picked up and is not in the orientation shown in FIG. 24, the program moves to the Step 7 to discard the picked up component. If, however, it has been determined at the Step 6 that the component "K" has been properly picked up, then the main controller 73 determines the necessary correction amounts "$X_c$, $Y_c$ and $\theta_c$" at the Step 8.

Figure 23:
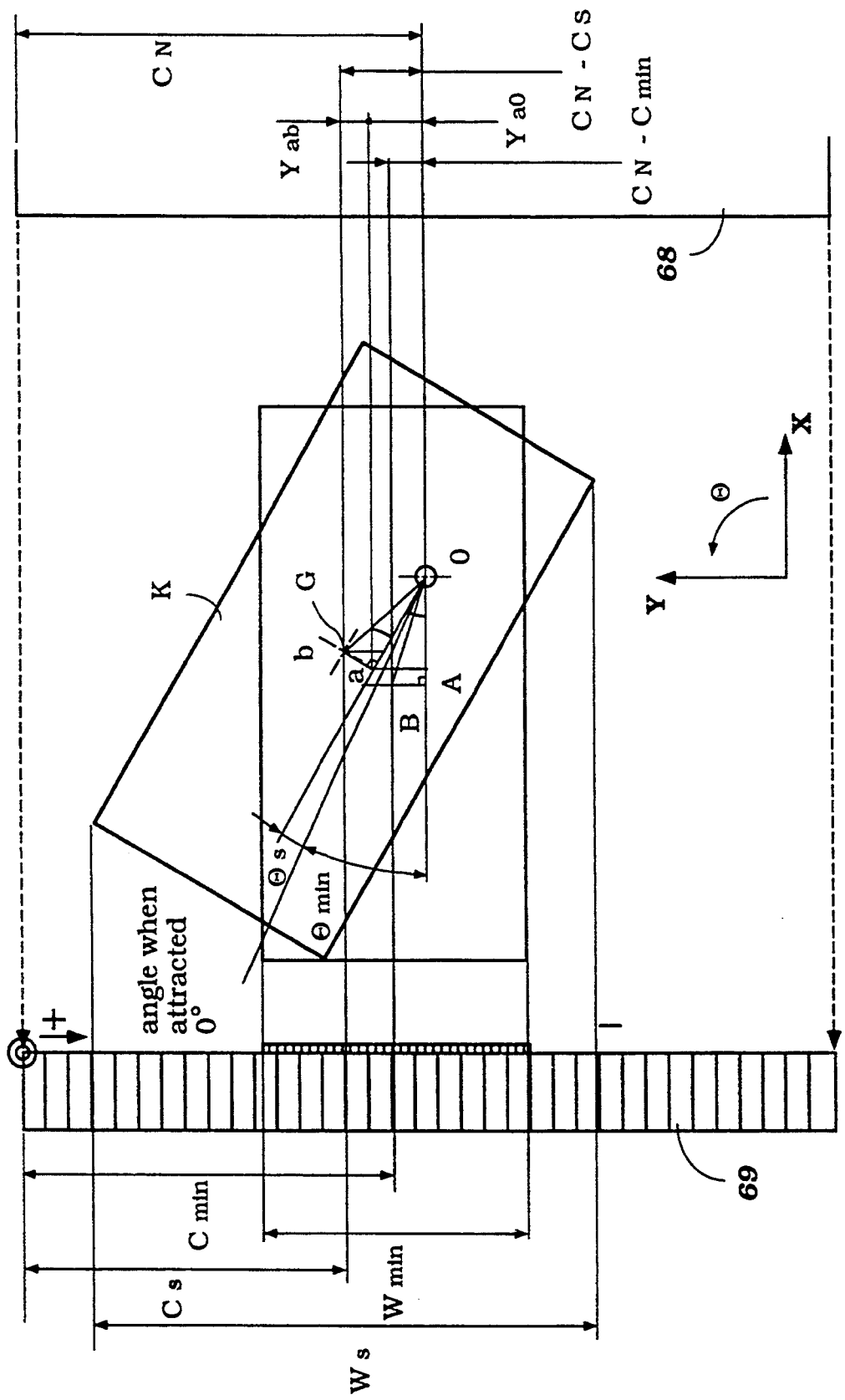
FIG. 23 is a further enlarged top plan view showing the component in its initial rotated position, in its minimum width condition and labeled to show how the correction calculations are made.
Figure 24:
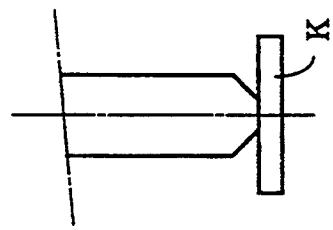

These calculations may be best understood by reference to FIG. 23 which shows in solid lines the $\theta_s$ position of the component "K" and its minimum width position. In this arrangement, the correction factors $Y_c$ and $\theta_c$ are easily determined in accordance with the following relationships:

$$Y_c = C_{min} - C_n$$

$$\theta_c = \theta_{min}$$

In these equations, $C_N$ is the center position of the attracting nozzle "O" as shown in FIG. 23 which is the distance from the edge of the measurement to the nozzle center which will be constant under all angular rotations of the component "K". Hence, $C_N$ is a known factor and thus $Y_c$ is easily calculated since $C_{min}$ is easily calculated. Hence, the correction amounts $Y_c$ and $\theta_c$ are values that are obtained substantially by actual measurement and no real calculation is required.

The value of $X_c$ however does require calculations using the date $C_s$, $\theta_s$, $C_{min}$ and $\theta_{min}$ obtained by the detected figures. The basis for these calculations are as follows and again reference is made to FIG. 23.

We know that $\triangle AOB = \triangle aOb$. Thus, a $b = AB = C_N - C_{min}$. Thus the projected length Wab of the side a b on the "Y" axis (the plane of measurement) can be determined from the following relationship:

$$Y_{ab} = (C_n - C_{min}) \cos(\theta_{min} + \theta_s)$$

Similarly the projected length $Y_{ao}$ of the side "a o" on the measurement plane of the "Y" axis is obtained by the following equation:

$$\begin{aligned} Y_{ao} &= a\, o \sin(\theta_{min} + \theta_s) \\ &= (C_N - C_s) - Y_{ab} \\ &= (C_N - C_s) - (C_N - C_{min}) \cos(\theta_{min} + \theta_s) \end{aligned}$$

Therefore, the correct ion amount $X_c$ and the "X" axis direction can be calculated from the above equation by the following equation:

$$\begin{aligned} X_c &= AO = aO \\ &= \frac{(C_N - C_s) - (C_N - C_{min}) \cos(\theta_{min} + \theta_s)}{\sin(\theta_{min} + \theta_s)} \end{aligned}$$

Once the correction factors are determined, and it is to be understood that this measurement and calculation may be done while the pick up head 61 is being moved toward the final mounting position, the component is moved to its final corrected mounting position. The correction about the rotational axis "R" ($\theta_c$) may be made at any time after the calculations have been made and during the movement of the carriage assembly 45 to the final mounting position. Of course, the corrections $X_c$ and $Y_c$ cannot be made until the final mounting of the component by the respective pick up head. This final mounting position is adjusted using the corrective factors $X_c$, $Y_c$ and $\theta_c$ determined as aforenoted.

The sub routine for final mounting is depicted in FIG. 18 and will now be described by reference to that figure. At the Step 1, the movement of the carriage 45 is begun. At the Step 2, it is determined if the specific pick nozzle is in the desired, corrected mounting position. If it is not, the program repeats. If, however, it is determined at the Step 2 that the mounting position is appropriately reached, then the "Z" axis servo motor 64 is energized so as to lower the pick up head 61 away from the detecting area 67.

At the Step 4 it is determined whether the pick up head 61 and specifically the component "K" has been lowered to the appropriate mounting position. If not, the program repeats. If, however, the pick up head 61 and component "K" have been lowered to the mounting position/ then the program moves to the Step 5 so as to discontinue the vacuum and deposit the piece "K" on the substrate.

Once the component "K" is released, the program moves to the Step 6 so as to elevate the pick up head 61 and pick up nozzle 62 so that the mounting operation is complete as the Step 7.

Figure 27:
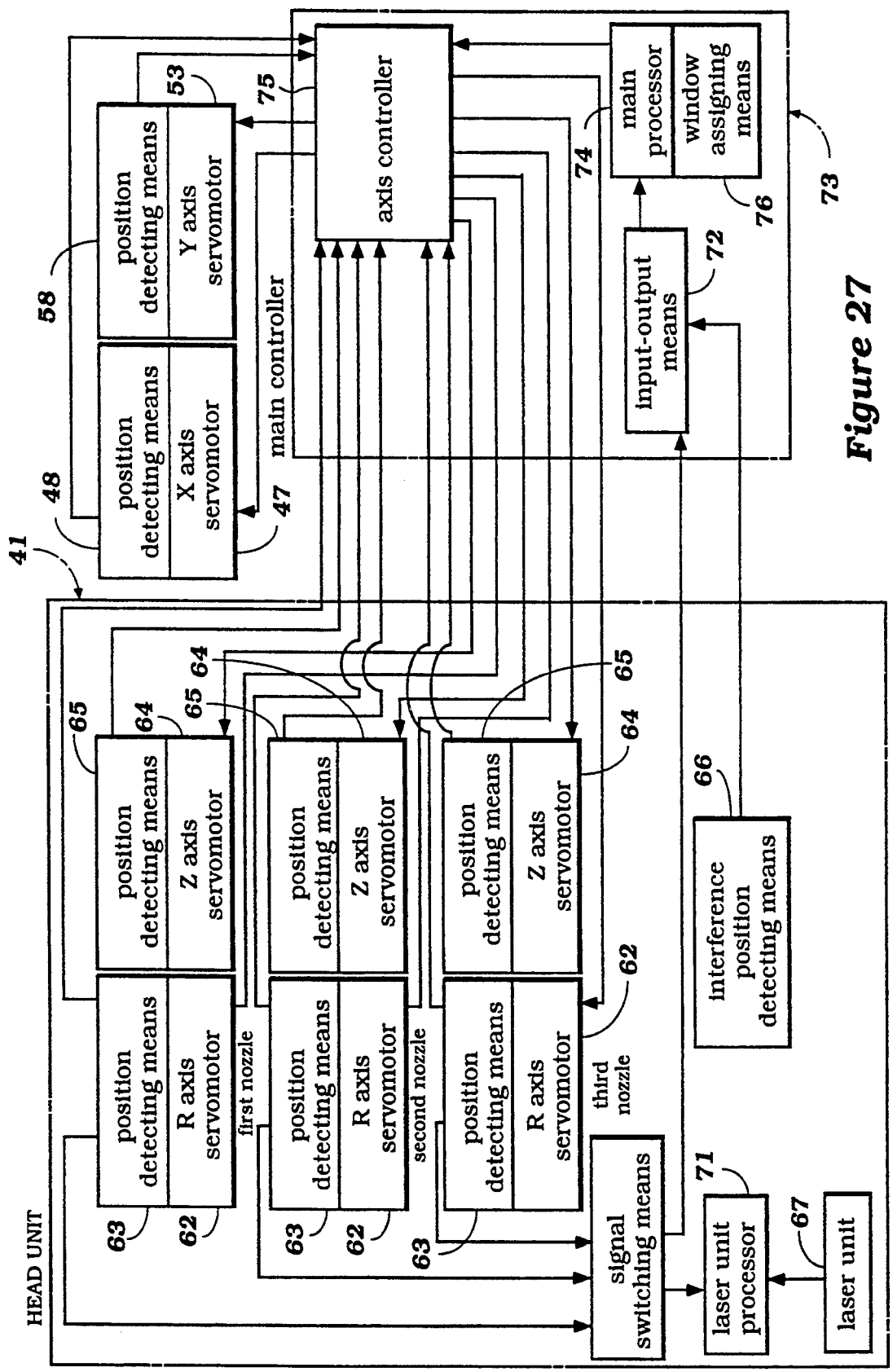
FIG. 27 is a block diagram, in part similar to FIG. 14, and shows another configuration for the apparatus to operate in accordance with another method.

In the embodiment as thus for described, it has been noted that the apparatus will have fed into it information as to the zone of the sensor head and specifically the CCD 69 that will relate to the size of the component that is picked up by each of the pick up devices 59 and the number of pick up devices which are employed. FIG. 27 shows another configuration for the apparatus that can be utilized in conjunction with the invention and also shows how the unit is configured so as to accommodate this selection and switching process.

Generally the construction shown in FIG. 27 is the same as that of FIG. 14. However, two additional units are employed in conjunction with this apparatus and except for these two additional units, all components here have been identified by the same reference numerals previously applied and the description of those components and thier interaction will not be repeated except in so far as in necessary to understand the construction and operation of this configuration and the methods by which it operates.

These added components include a signal switching means 75 that is interposed between the position detectors or encoders 63 associated with the "R" axis servo motors 62 and the laser processing unit 71 and which also is switched in response to the output from the input/output means 72 of the main controller 73. In addition, there is provided a window assigning means 76 that is associated with the in processor 74 and which receives the signal from the feeders 44 to provide an indication of the maximum rotational dimension of the components "K" which are to be picked up by the various nozzles.

Figure 28:
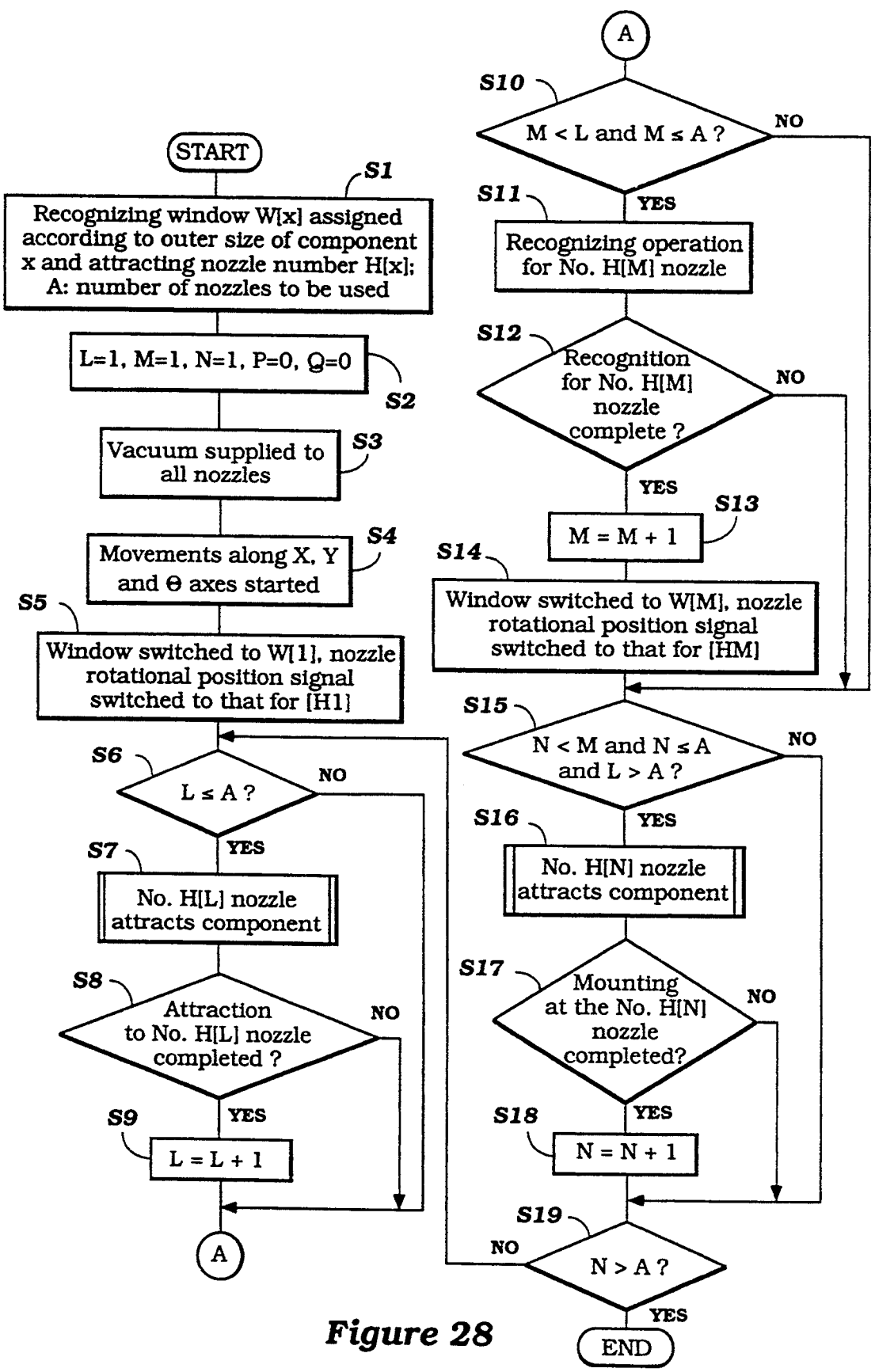
FIG. 28 is a block diagram showing a type of control routine which may be performed with the apparatus as configured in FIG. 27.
Figure 29:
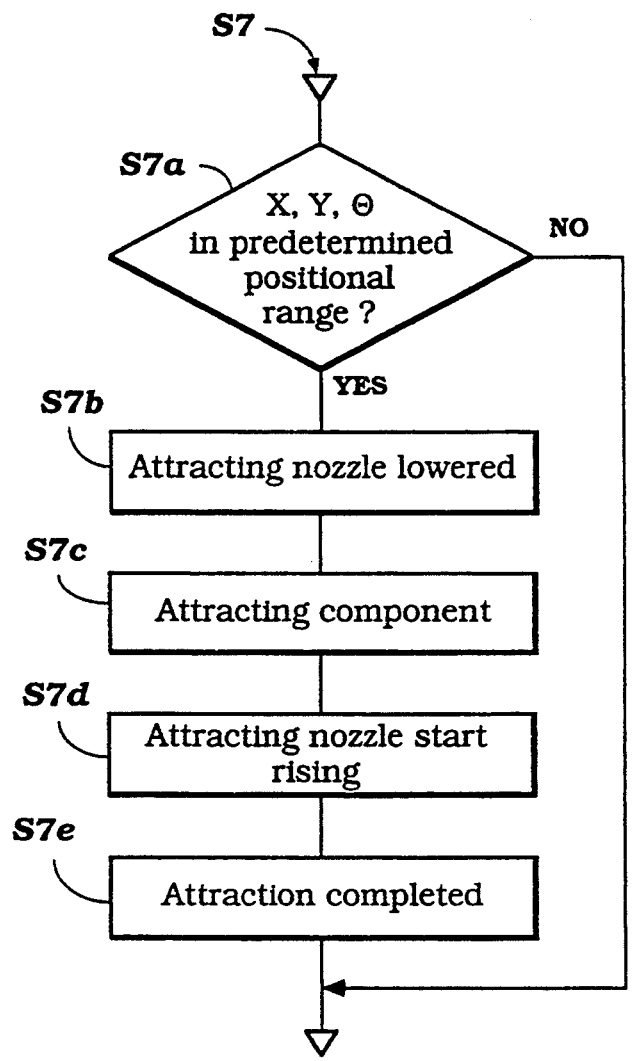
FIG. 29 is a block diagram showing a sub control routine for the routine show in FIG. 28 and specifically the sub routine for picking up a component by the pick up nozzle.
Figure 30:
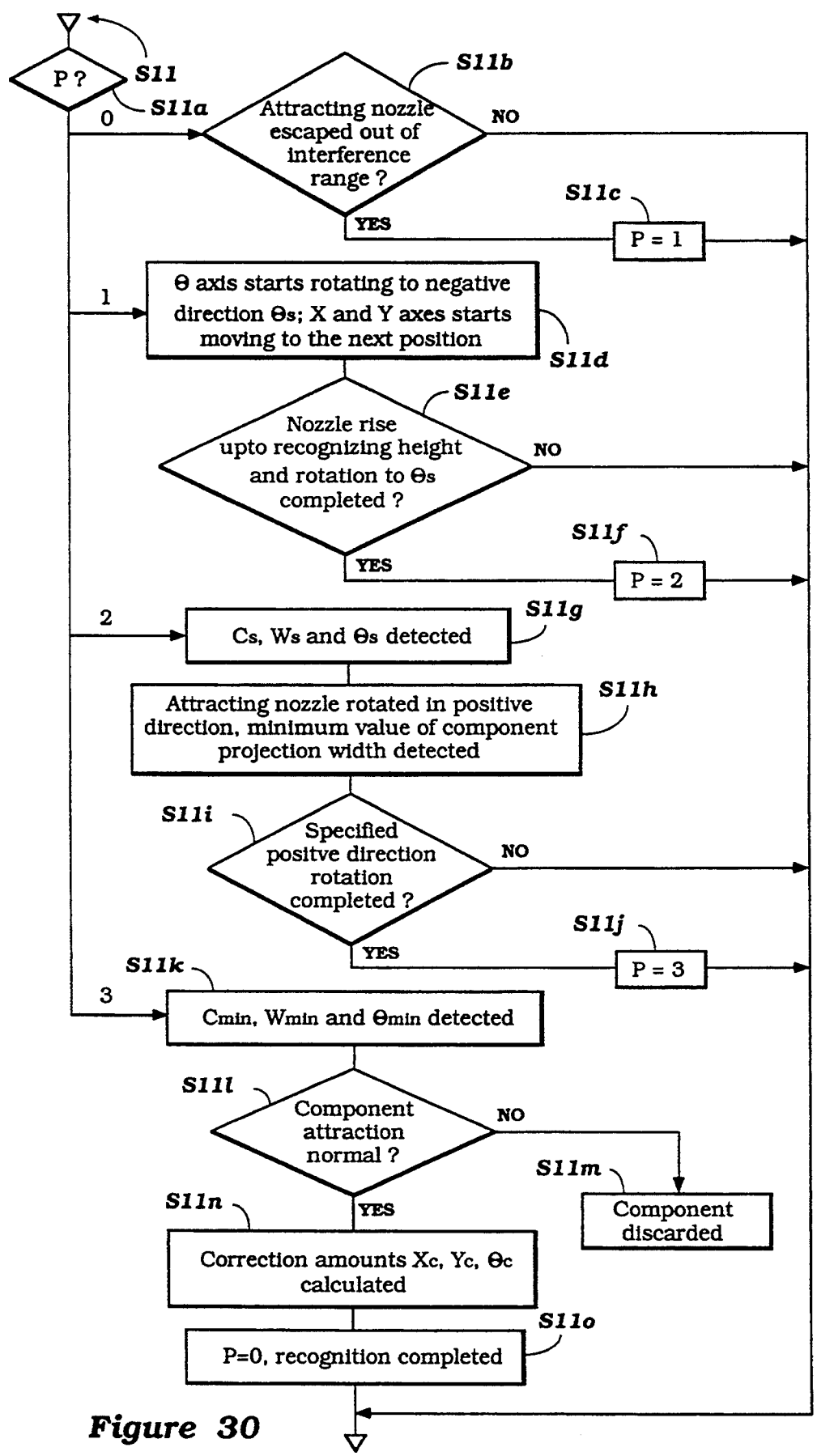
FIG. 30 is a block diagram showing a further sub control routine for the routine of FIG. 28 and specifically the control routine for determining the orientation of the picked up component and calculating the correction factors.
Figure 31:
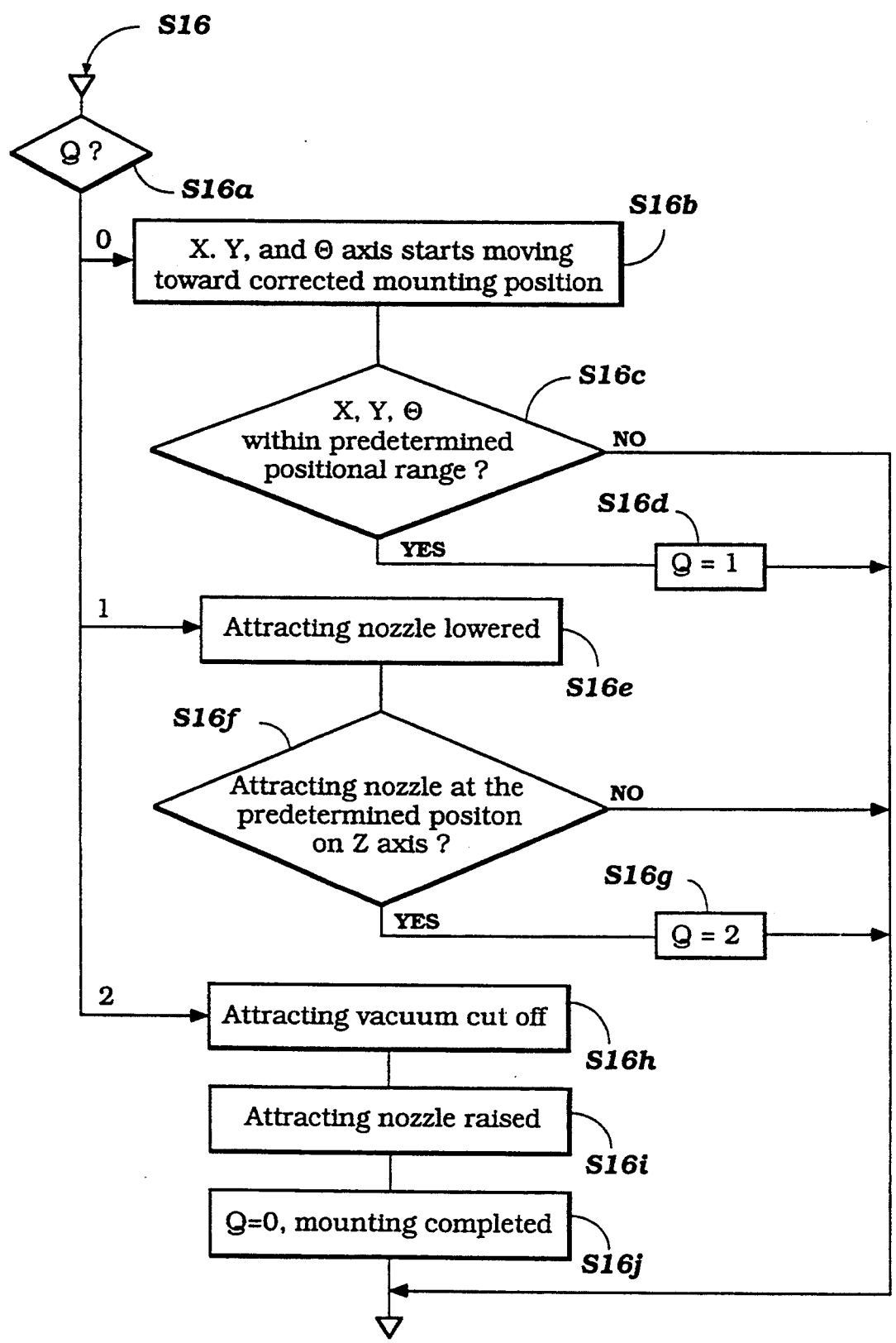
FIG. 31 is a block diagram of a further sub control routine of the routine show in FIG. 28 and specifically the mounting routine.

One possible control routine by which the apparatus configured as shown in FIG. 27 may be operated, is illustrated in FIG. 28 which certain sub routines being depicted in FIGS. 29 through 31. It should be noted that the control routine described in these figures is actually independent of the number of nozzles which are employed. That is, in the proceeding embodiment, three pick up heads 59-1, 59-2 and 59-3 were employed. The control routine now to be described can be employed with an apparatus that employs any number of nozzles.

The program will be described by initial reference to FIG. 28 with the description of FIGS. 29, 30 and 31 to follow. It is believed that this descriptive method will permit the reader to more fully and more clearly understand how the system operates and the relationship of the various steps to each other.

When the program starts, it initially moves to Step 1 so that the window $W_x$ assigned to each component "x" to be picked up is determined. The determination of the nozzle number $H_x$ to be utilized for each component picked up will be determined and also the number of nozzles "A" to be employed will also be determined. These determinations are preprogrammed into the main controller 73 and specifically its main processor 74 from information stored therein as to the maximum dimensions that can be handled by all of the nozzles together or groups of the nozzles and which nozzles should be utilized for holding components of the anticipated sizes to be mounted.

Once the windows have been assigned and the number of nozzles to be used has been determined, the program moves to the Step 2 so as to initialize the system by setting certain variables such as the variable "L" indicating the sequential number of the attracting nozzle employed, a variable "M" for the number of the attracting nozzles for which the recognizing operation has been performed for obtaining the component mounting position correcting amount, as previously noted, a variable "N" for showing the number of nozzles for which components have already been mounted on the substrate, a variable "P" showing the stage to which the recognizing operation has proceeded and a variable "Q" showing the stage to which the mounting operation has been proceeded. These variables are set initially at:

$L = 1$
$M = 1$
$N = 1$
$P = 0$
$Q = 0$

The program then moves to the Step 3 wherein vacuum is supplied to all of the pick up nozzles 61 or at least of the all pick up nozzles 61 which will be employed to pick up components "K" . The program then moves to the Step 4 so as to begin movement along the "X" and "Y" axes and also to rotate about the $\theta$ axis.

The program then moves to the Step 5 so as to switch the window to the first window W and also to switch the signal switching means 75 to the first nozzle that will be used for pick up $H_1$. The foregoing steps are initiated only at the initial start up of the operation of the unit.

The program then moves to the Step 6 to determine the number of the nozzles "L" for which a pick up nozzle 61 has actually completed a pick up operation. If this number is less than or equal to total number of nozzles to be employed "A" , as it will during the initial start of operation when $L = 1$, the program then moves to the Step 7 at which the nozzle $H_L$ initiates pick up operation with the pick up operation as being described in the sub routine of FIG. 29 later.

The program then moves to the Step 8 to determine if pick up at the nozzle $H_n$ has been completed, this being the nozzle $H_1$ in the first sequence.

If the pick up has been completed as determined at the Step 8, the program moves to the Step 9 to advance the value of "L" by "1" and the program then repeats back to the Step 6 and also moves forward to the Step 10. As will be seen by the flow chart, if at the Step 6 "L" was equal to "A" , the program would have immediately moved to the Step 10. Also, if the attraction at the pick up nozzle $H_L$ as determined at the Step 8 was not completed, the program would also advance to the Step 10.

At the Step 10, a determination is made whether the number "M" for the attracting nozzle for which recognition has been practiced is less than "L" and also to determine if that number is less than or equal to "A" . Thus, in the case where the first pick up nozzle was picking up a component at the Step 7 and that pick up had been successfully completed then "M" would be "1" and "L" would now be "2" the program would proceed to the Step 11.

At the Step 11, the recognizing and correction calculating method, performed in accordance with the sub routine of FIG. 30 would be initiated for the nozzle $H_M$, in this case $H_1$.

The program then moves to the Step 12 so as to determine if the recognition for the nozzle $H_M$ (in this case $H_1$) had been completed. If so, the program would move to the Step 13 so as to advance "M" by one count, in this example "M" would then be advanced to "2" and the program would then move to the Step 14 so as to switch the window to the new nozzle $W_2$ to perform the next recognition and correlation operation.

The program then moves to the Step 15. It should be noted also that if at the Step 10, "M" has been determined to be not less than "L" or "M" has been determined to be not less than or equal to "A" or if at the Step 12 the recognition for the nozzle $H_M$ has not been completed, the program will also advance to the Step 15.

At the Step 15, it is determined if the number of the nozzles which have mounted components (N) is less than the number of chips which has been recognized and for which the mounting position correction amount has been calculated (M) and the number of components mounted "N" is less than or equal to the number of attracting nozzles used "A". If the number of components mounted is not less than these factors, the program skips to the Step 19. Also at the Step 15 it is determined if the number of the nozzle, for which components has been attracted is less than the total number of nozzles, the program also skips to the Step 19. If, however, the answer determined at the Step 15 is positive, the program moves to the Step 16.

At the Step 16 the next nozzle in sequence, $H_N$, initiates its mounting phase. This mounting phase is done in accordance with the sub routine shown in FIG. 31.

The program then moves to the Step 17 to determine if the mounting has been completed at the nozzle $H_N$. if not, the program skips to the Step 19.

If, however, at the Step 17 it is determined that the nozzle $H_N$ has completed its mounting procedure, the program moves to the Step 18 to add an integer to "N" so as to obtain a new value of "N". The program then moves to the Step 19, if it has not already jumped to this step.

At the Step 19, it is determined if "N" is greater than "A". It should be remembered that "N", when all nozzles have mounted, will be A+1. Thus, if the answer at Step 19 is positive, the program ends. If it is not, the program repeats back to the Step 6.

Thus, with this routine it will be noted that the components are picked up, recognized and orientation determined and mounted in sequence. However, if during the pick up, recognition and/or mounting phases any operation is not performed completely, the program will repeat back to insure that the missed step will be completed while at the Same time continuing the sequence as much as is possible. Thus, the operation is much quicker than can be accomplished if only one pick up nozzle is employed and each step must be completed before the next is begun.

Turning now to the sub routines, the pick up sub routine of FIG. 29 is similar to those previously described in that it includes the Step 7a in which the determination is made whether the pick up nozzle 61 is in the required position and at the required angle. If it is not, the program skips on to the Step 8 and will repeat in accordance with the aforedescribed routine. If, however, the pick up nozzle 61 is in the appropriate position, then it is lowered by energizing the "Z" axis servo motor 64 at the Step 7b and the component is attracted at the Step 7c.

The program then moves to the Step 7d wherein the pick up nozzle 61 is elevated again by actuated the "Z" axis servo motor 64 and this elevation is continued through the Step 7e until full elevation is completed. The attraction is completed and the appropriate flag is set indicated that the pick up has been accomplished at this station.

The recognition and correction calculation procedure will now be described by particular reference to FIG. 30 wherein this sub routine is depicted. This routine starts, as afornoted, after the Step 11 and the first step of this sub routine is Step 11a wherein the value of "P" is determined. As aforenoted, the value of "P" is an arbitrary value which is originally set at zero (0) and which determines the stage at which the recognition and correction calculating is determined. If P=0, the program moves to the Step 11b to determine if the appropriate attracting nozzle is out of the interference phase (free to begin movement). If it is not, the program skips to the Step 12 of the control routine of FIG. 28.

If, however, the attracting nozzle 61 has moved out of the interference range, as determined by the interference position detecting means 66 of the appropriate pick up nozzle, then "P" is advanced by "1" step (P=1) and the program moves on to the Step 12. When the program again returns to the Step 11, the next instance the value of "P" will be "1" and once P=1, the Step 11d is begun. This step starts rotating the pick up nozzle 61 in the negative or reverse direction to the position $\theta_s$. Simultaneously therewith, the "X" and "Y" motors will start movement to the next position. The program then moves to the Step 11e to determine if the pick up nozzle 61 has been raised to the recognized height position in proximity to the laser unit 67 and if the rotation to the position $\theta_s$ is completed. If not, the program repeats.

If, however, the nozzle now has the component in proximity to the sensing unit 67 so that recognition can be begun, the program moves to the Step 11f to add another integer to "P" (P=2) and the program then skips to the Step 12.

Hence, once "P" equals "2" the program moves from the Step 11a to the Step 11g wherein $C_s$, $W_s$ and $\theta_s$ are detected. The program then moves to the Step 11h so as to rotate the pick up nozzle 61 to the position wherein the minimum dimension is calculated as aforenoted in conjunction with the description of the Steps 4, 8, 10 and 12 of the control routine of FIG. 15 or specifically the sub routine of FIG. 17.

The program then moves to the Step 11i to determine whether the rotation of the pick up nozzle has been completed to the final angle. If it has not, the program skips again to the Step 12. If it has, however, another integer is entered to the value of "p" (P=3) at the Step 11j and the program skips to the Step 12.

Once P=3, then the minimum width value, the value of $C_m$ and the value of $\theta_m$, are detected at the Step 11k in the manner as previously described. The program then moves to the Step 11i to determine if the component attraction was normal as previously described in conjunction with the description of the Step 6 of FIG. 17. If it is not had a normal pick up, the program then moves to the Step 11m and the component is discarded.

If, however, the pick up has been determined to be normal at the Step 11i, the program then moves to the Step 11h so as to calculate the correction amounts $X_c$, $Y_c$ and $\theta_c$ and the program moves to the Step 11o to indicate that program recognition and calculation has been completed and "P" is again is reset to zero (0). The program then proceeds to the Step 12 of FIG. 28.

The mounting sub routine will now be described by reference to FIG. 31 which routine, as has been noted, begins after the Step 16. The first step at Step 16a is to determine the value of "Q" for the particular nozzle in question. Assuming that this is the first step in the mounting routine, the program move to the Step 16b so as to start movement in the "X" "Y" and "$\theta$" directions to the corrected mounting position. The program then moves to the Step 16c to determine if the pick up nozzle 61 is in the correct mounting position. If it is not, the program skips to the Step 17 of FIG. 28. If, however, the position is correct, then the Program adds the value of "1" to "Q" so that "Q" will now equal "1" and the program skips to the Step 17.

When it is determined at the Step 16a the value of "Q" for the nozzle in question is "1" then the program moves to the Step 16e so as to lower the nozzle 61 since it is now the appropriate position. This is accomplished by actuating the respective "Z" axis servo motor 64.

At the Step 16f it is then determined whether the attracting nozzle is at the appropriate position along the "Z" axis to accomplish mounting. If it is not, the program skips to the Step 17. If it is at the correct mounting position, then, the program adds one integer to the value of "Q" (Q=2) at the Step 16g and the program jumps to the Step 17 of FIG. 28.

Once the value "Q" of the pick up nozzle in question is set at "2", then the program moves from the Step 16a to the Step 18h so as to shut off the vacuum for the appropriate pick up. The pick up nozzle 61 is then raised by actuating the "Z" axis servo motor 64 at the Step 16i and once the mounting nozzle is completely raised, then the value is of "Q" for this nozzle is set back to zero (0) at the Step 16j.

Thus, with this control routine it will be seen that components "K" are successively attracted by the respective pick up nozzles 61 through the routine shown in FIG. 29, recognition operation is carried out through the routine shown in FIG. 30 for pick up nozzles which have picked up components and the attraction operation for nozzles which have not picked up components yet and recognition for nozzles which have not yet performed this operations are advanced simultaneously in parallel with each other. Furthermore, when all "A" of the pick up nozzles 61 have attracted respective components "K", the mounting portion 41 is moved to the mounting routine and the components are mounted successively through the routine shown in FIG. 31. For those pick up nozzles 61 for which recognition operation has been completed and the recognition operation for a nozzle which recognition has not been completed, if any, the head of the mounting unit is moved toward the mounting position and the pick up nozzle 61 and its component "K" are recognized while this movement continues. Hence, the operations of attractions, recognition and mounting are carried in parallel as far as possible with the structure and operating efficiency is achieved.

Figure 32:
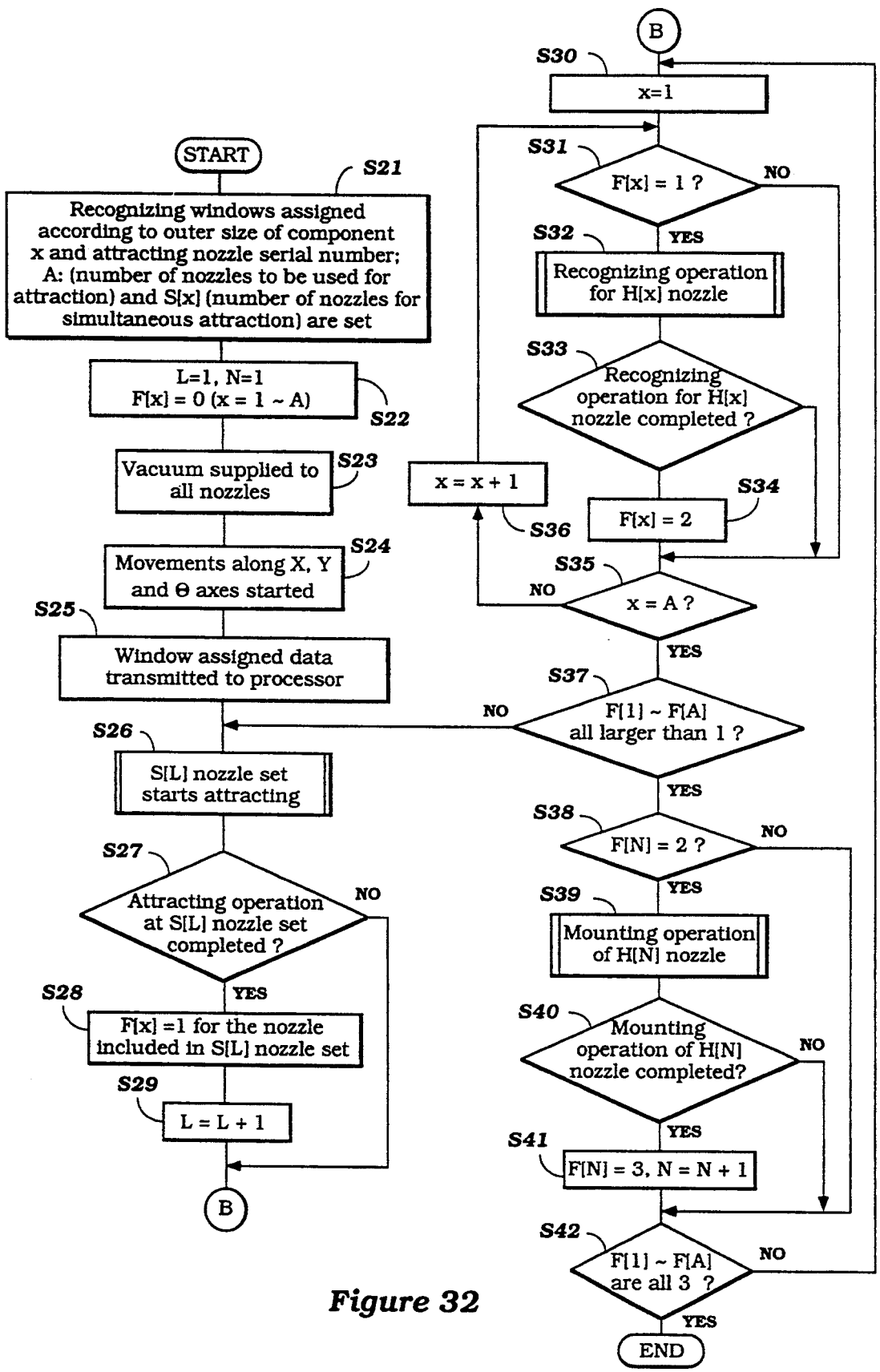
FIG. 32 is a block diagram showing another form of control routine that may be employed with the apparatus configured as shown in FIG. 33.
Figure 33:
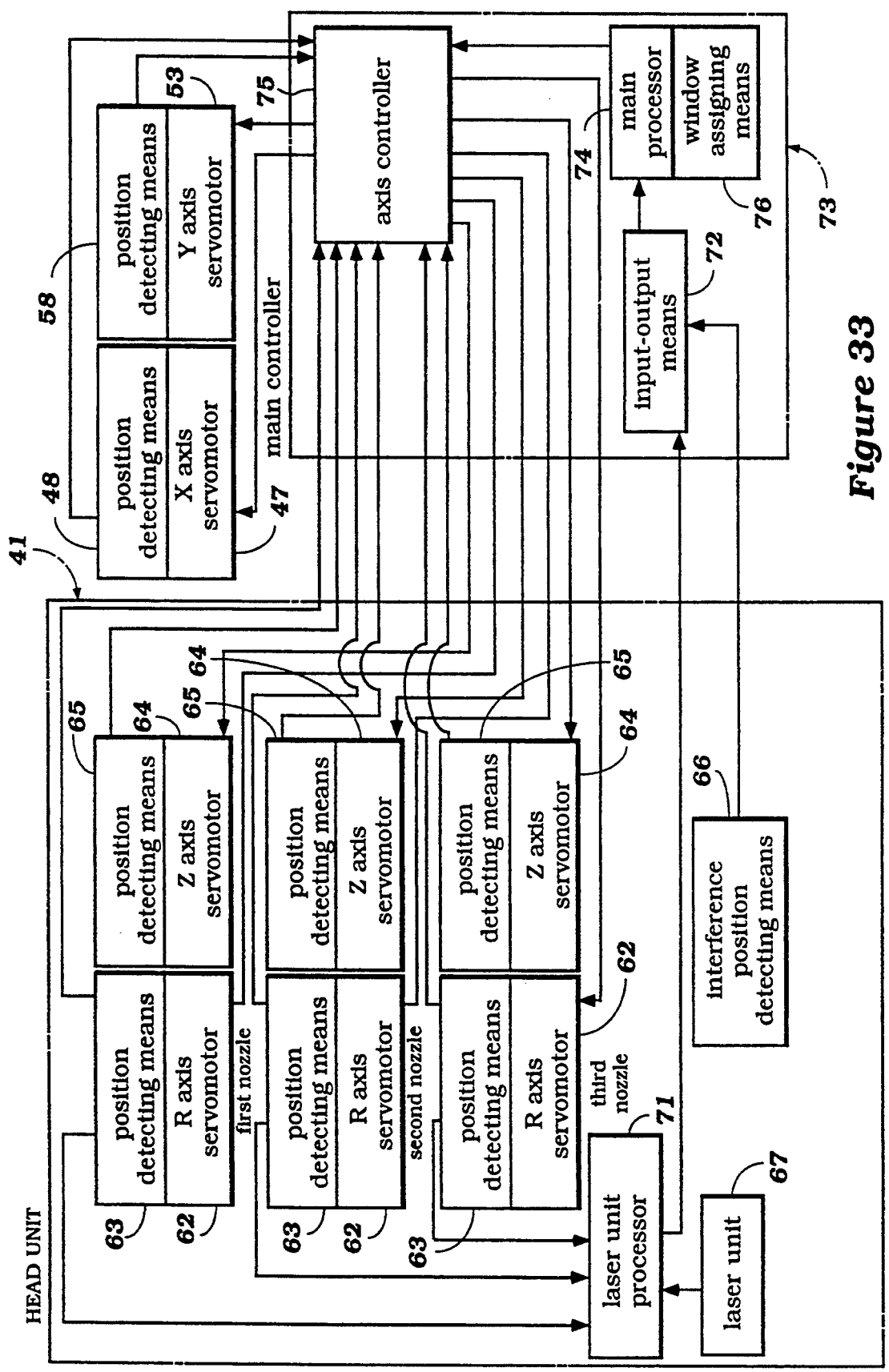
FIG. 33 is a block diagram, in part similar to FIGS. 14 and 27, and shows an apparatus configuration for performing the routine of FIG. 32.

FIG. 32 shows another control routine which may be operated with the apparatus configured as show in FIG. 27 wherein all of the active pick up nozzles 61 are attracted simultaneously and the recognition and correction values computer simultaneously. The only difference from the configuration of FIG. 27 is that the position detecting means 63 for the "R" axis servo motors 62 are directly connected to the laser processor unit 71 rather than being connected through a signal switching means 75. Such a configuration is shown in FIG. 33.

This control routine as shown at FIG. 32 starts and then moves to the Step 21 which is generally similar to the operation at Step 1 of the control routine of FIG. 28 in that recognizing windows $W_x$ are assigned to each nozzle depending upon the outer size of the component "x" to be attracted by that nozzle and the number of nozzles used for attraction is set at "A" and the number of nozzles set for simultaneous attraction is set as $S_x$.

The program then moves to the Step 22 so as to set the variables "L" and "N" as previously referred to in connection with the routine of FIG. 28 and set the flags $F_x$ for each nozzle as equal to zero (0). The flags $F_x$ shows the progressively state of operation for each nozzles and their values 1, 2, or 3 show the progressive state of operation of each nozzle with the value "1" meaning attraction operation is completed, the value "2" meaning recognition operation and correction factor calculation has been completed, and the value "3" indicating that mounting operation has been completed. A flag is set for each nozzle up to the total number of nozzles which will be used for attraction in the given components sizes to be picked up.

The program then moves to the Step 23 so as to apply vacuum to all nozzles which will be utilized and the program then moves to the Step 24 so as to begin movement along the "X" and "Y" axes and rotation about the "Z" axes.

The program then transfers the window assigned date $W_1$ through $W_A$ for the respective nozzles to the main processor 74.

Next, the program moves to the Step 26 wherein all of the simultaneously actuating nozzles $S_n$ are begun simultaneously with their attracted step as show in FIG. 29 of the sub routine of FIG. 28.

The program then moves to the Step 27 to determine if the attraction operation of all of the nozzles $S_L$ has been completed. If not, the program skips to the Step 30 as will be described later.

If, however, all Of the simultaneously actuated nozzles $S_L$ have been determined to have completed their pick up operation at the Step 27, the program,moves to the Step 28 where the value of the flags for all of the simultaneously actuated nozzles is set at "1" ($F_x=1$). The number of the nozzles to be set next for attraction "L" is then increased by "1" at the Step 29 and the program moves to the Step 30.

The Steps 30 through 36 are the steps wherein recognition operation is completed for all nozzles which have picked up components. The value of "x" in the formula $F_x$ is set at "1" at the Step 30 and then it is investigated at the Step 31 whether the attracting nozzle in question has attracted a component to determine if its flag is equal to "1" ($F_x = 1$). If for a given step the nozzle has determined to have pick up a component. ($F_x=1$), the recognition operation for the nozzle in question $H_x$ is begun at the Step 32. This control routine is that as set forth in the sub routine of FIG. 30 for the aforedescribed routine of FIG. 28 and the same "P" values are employed.

Once the recognition has been completed and the correction factor computed at the Step 33, the program moves simultaneously to the Step 34 to change the value of "x" in the flag for the nozzle to "2" and to the Step 35 so as to determine if "x" equals the number of nozzles utilized (x=A). If the value of "x" is not equal to "A", the program moves to the Step 36 so as to advance the value of "x" by "1" so as to complete the recognition operation for all remaining nozzles which have not picked up components.

If the nozzle bearing the recognition number "1" is one of the simultaneously picked up nozzles, the recognition data for all of those nozzles is also completed simultaneously.

Once at the Step 35 it is determined that recognition is accomplished for all of the nozzles utilized (x=A), the program then moves to Step 37 to determine if all of the attracting nozzles have at least attracted respective components by determining if all of the flags $F_1$ through $F_A$ is greater than "1". If not, the program repeats back to the Step 26 so as to see that the remaining nozzles have picked up components.

The program then moves to the Step 38 to again confirm that all nozzles have had their recognition and correction factor operation completed. If not, the program skips to the Step 42. If, however, it is determined at the Step 38 that recognition for all nozzles have been completed, then the programs moves to the Step 39 wherein the mounting operation for each nozzle is completed in accordance with the sub routine shown in FIG. 31 for the control routine of FIG. 28. The program then moves to the Step 40 to determine if the mounting operation for each nozzle has been completed and if it has not, the program jumps to the Step 42.

Once it has been determined at the Step 40 that the mounting for the particular nozzle has been completed, then the program moves to the Step 41 so as change the function value or the flag for each nozzle to "3" end the number of the nozzles for which mounting has been completed is added by one integer (N=N+1). The program then moves to the Step 42 to determine if the flag values for all flags are at "3" ($F_1$ through $F_A=3$?). If all mounting has not been completed, the program then repeats back to the Step 30. However, if all mounting has been completed then the program ends.

From the foregoing description, it is should be readily apparent that the described methods of operation and apparatus permit a very rapid and highly accurate arrangement whereby a plurality of components may be handled and mounted. Of course, the foregoing description is that of preferred embodiments of the invention and various changes and modifications may be made without departing from the spirit and scope of the invention, as defined by the appended claims.

We claim:

1. A method of picking up and mounting components with a apparatus comprising a carriage supported for translatory movement, a plurality of pick up devices carried by said carriage and each adapted to pick up a respective component and a sensing station for detecting information from components held by said pick up devices, said method comprising sensing of all components carried by each of said pick up devices in the sensing station a single position of said carriage.

2. A method as set forth in claims 1 wherein the sensing station comprises an optical sensor having a light source and a receptor.

3. A method as set forth in claim 2 wherein the optical sensor is used for measuring the orientation in which the components are picked up by the pick up devices.

4. A method as set forth in claim 3 wherein the measuring is effected by rotation of each component, about an axis defined by the pick up devices.

5. A method set forth in claim 3 wherein the rotation is accomplished initially in one direction and finally in the opposite direction.

6. A method as set forth in claim 5 wherein the pick up devices are moved between a lowered pick up and depositing position and a raised transporting position.

7. A method as set forth in claim 6 wherein at least a portion of the sensing operation is performed on each component during the movement from its lowered position wherein a component has been picked up and its raised position.

8. A method as set forth in claim 7 further including the steps of determining when the component has cleared the pick up area and for initiating the sensing operation thereafter.

9. A method as set forth in claim 2 wherein the pick up devices are staggered relative to the axis of the light rays from the light source the optical sensor so that components carried by each of the pick up devices can be optically sensed in the same location.

10. A method as set forth in claim 9 wherein the sensor is aligned in a plane of movement of the carriage and the pick up devices are skewed relatively to the plane.

11. A method as set forth in claim 1 wherein the sensing of the components is all carried out simultaneously.

12. A method as set forth in claim 1 wherein the sensing of the components is done sequentially, 13. A method as set forth in claim 2 wherein each pick up device is rotatable about a rotational axis "R" and the projected length of each component is measuredly in a plane parallel to the axis of rotation of the pick up device on the receptor and the projected length of each, component is measured in the plane at two angular rotations and the angular rotation between the two measured positions is measured for determining the place where the component has been picked up by the respective up device.

14. A method as set forth in claim 13 wherein each component is rotated to a second position wherein the projected length in the plane is at an extreme of the projected length in the plane.

15. A method as set forth in claim 14 wherein the projected length in the second position is the narrowest length.

16. A method as set forth in claim 14 wherein the component is rotated to an initial angular position prior to the measurement.

17. A method as set forth in claim 16 wherein the initial rotation is in a direction opposite from the direction of rotation from the first position to the second position.

18. A method as set forth in claim 16 wherein each component is rotated to the initial position prior to the beginning of measurements and when the component is initially picked up.

19. A method as set forth in claim 13 wherein the sensing of the components is all carried out simultaneously.

20. A method as set forth in claim 13 wherein the sensing of the components is done sequentially.

21. A method as set forth in claim 13 wherein a window on the receptor is selected corresponding to each of the components picked up by the pick up device depending upon the size of the component picked up.

22. A method for picking up and mounting components utilizing an apparatus comprising a carriage assembly supported for translatory movement, a plurality of pick up devices supported by said carriage and each adapted to pick up a respective component, and a sensing station said method comprising picking up of a component by one of said pick up devices simultaneously with the performance of a sensing operation on a component held by another of the pick up devices in the sensing station.

23. A method as set forth in claim 22 wherein the component upon which the performance of the sensing operation is performed is a component previously picked up by the other pick up device.

24. A method as set forth in claim 23 wherein the component picked up by the one pick up device is subsequently also subjected to a sensing operation.

25. A method as set forth in claim 24 wherein the sensing operation involves rotation of each component and the respective pick up device in a common sensing station.

26. A method for picking up and mounting components utilizing an apparatus comprising a plurality of pick device each adapted to pick up a respective component all mounted on a common carriage for translatory movement, said pick up devices being positioned in close proximity to each other, said method comprising precluding the picking up of a component by one of said pick up devices when the component picked up by an adjacent pick up device has a configuration that would interfere with a component if picked up by the one pick up device.

27. A method as set forth in claim 26 wherein there are at least three pick up devices each adapted to pick up a respective component and wherein when one component large enough to obscure picking up of components by the remaining pick up devices is picked up no components are picked up by the other pick up devices, two components of either the same or different sizes are picked up by two pick up devices or three components are picked up each by a respective pick up device.

28. A device for picking up and mounting components comprising a carriage support for translatory movement, a plurality of pick up devices carried by said carriage and each adapted to pick up a respective component and a sensing station including sensing means for detecting information from components held by said pick up devices, said sensing means having a sensing field sensing without interference of all components carried by each of said pick up devices in a single position of said carriage.

29. A device as set forth in claim 28 wherein the sensing means comprises an optical sensor having a light source and a receptor.

30. A device as set forth in claim 29 wherein the optical sensor is used to measure the orientation in which the components are picked up by the pick up devices by processing an output of the receptor.

31. A device as set forth in claim 30 wherein each pick up device is rotatable about a respective axis the orientation measuring is effected by rotating each component about the axis defined by the respective pick up device.

32. A device set forth in claim 31 wherein the rotation of each component is initially in one direction and subsequently in the opposite direction.

33. A device as set forth in claim 32 wherein the carriage carries means for supporting the pick up devices for movement between a lowered pick up and depositing position and a raised transporting position in addition to rotation about the respective pick up device axis.

34. A device as set forth in claim 33 wherein the optical sensor performs at least a portion of the sensing operation on each component during the movement of the pick up device from its lowered position wherein a component has been picked up and its raised position.

35. A device as set forth in claim 34 further including means for determining when the component has cleared the pick up area and for initiating the sensing operation thereafter.

36. A device as set forth in claim 28 wherein the pick up devices are staggered relative to an axis of the light rays from the light source of the optical sensor so that components carried by each of the pick up devices can be optically sensed by the receptor in the same location.

37. A device as set forth in claim 36 wherein the light rays define an axis that is aligned in a plane of movement and the pick up devices are skewed relatively to the plane of the light rays.

38. A device as set forth in claim 28 wherein the sensing of the components is all carried out simultaneously.

39. A device as set forth in claim 28 wherein the sensing of the components is done sequentially.

40. A device as set forth in claim 29 wherein each pick up device is rotatable about a rotational axis "R" and the optical sensor measures the projected length of each component in a plane parallel to the axis of rotation of the pick up device on the receptor and measures the projected length of each component in the plane at two angular rotations and measured the angular rotation about the "R" axis between the two measured positions for determining the place where the component has been picked up by the respective up device.

41. A device as set forth in claim 40 wherein each component is rotated about the "R" axis to a second position wherein the projected length in the plane is at an extreme of the projected length in the plane.

42. A device as set forth in claim 41 wherein the projected length in the second position is the narrowest length.

43. A device as set forth in claim 41 wherein the component is rotated to an initial angular position prior to the measurement.

44. A device as set forth in claim 43 wherein the initial rotation is in a direction opposite from the direction of rotation from the first position to the second position.

45. A device as set forth in claim 43 wherein each component is rotated to the initial position prior to the beginning of measurements and when the component is initially picked up.

46. A device as set forth in claim 40 wherein the sensing of the components is all carried out simultaneously.

47. A device as set forth in claim 40 wherein the sensing of the components is done sequentially.

48. A device as set forth in claim 40 wherein the device selects a window on the receptor corresponding to each of the components picked up by the pick up device depending upon the size of the component picked up.

49. A device as set forth in claim 29 wherein there is a single light source that conveys light rays on all of the components in the single position of the carriage and in the sensing station.

50. A device as set forth in claim 29 wherein there is a single receptor positioned for receiving an image from all of the components within the sensing station.

51. A device for picking up and mounting components comprising a carriage assembly supported for translatory movement, a plurality of pick up devices supported by said carriage for movement relative to said carriage to pick up a respective component, a sensing device for performing a sensing operation carried by said carriage, means for effecting the picking up of a component by one of said pick up devices simultaneously with the performance of an sensing operation by said sensing device on a component carried by another of the pick up devices.

52. A device as set forth in claim 51 wherein the component upon which the performance of the sensing operation is performed is a component previously picked up by the other pick up device.

53. A device as set forth in claim 52 wherein the component picked up by the one pick up device is subsequently also subjected to a sensing operation by the sensing device.

54. A device as set forth in claim 53 wherein the sensing operation involves rotation of each component and the respective pick up device in sensing station in which the sensing device is positioned.

55. A device for picking up and mounting components comprising a plurality of pick device each adapted to pick up a respective component all mounted on a common carriage for simultaneous translatory movement, said pick up devices being positioned in close proximity to each other, and control means for precluding the picking up of a component by one of said pick up devices when the component picked up by an adjacent pick up device has a configuration that would interfere with a component if picked up by the one pick up device.

56. A device as set forth in claim 55 wherein there are at least three pick up devices each adapted to pick up a respective component and wherein the control means selects the picking up only one component by one of the pick up devices when that component is large enough to obscure picking up of components by the remaining pick up devices, picking up of two components of either the same or different sizes or picking up of three components one by each pick up device.

* * * * *